United States Patent
Kosugi et al.

(10) Patent No.: US 9,269,638 B2
(45) Date of Patent: Feb. 23, 2016

(54) TEMPERATURE DETECTING APPARATUS, SUBSTRATE PROCESSING APPARATUS AND METHOD OF MANUFACTURING SEMICONDUCTOR DEVICE

(71) Applicant: HITACHI KOKUSAI ELECTRIC INC., Tokyo (JP)

(72) Inventors: Tetsuya Kosugi, Toyama (JP); Masaaki Ueno, Toyama (JP); Hideto Yamaguchi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 8 days.

(21) Appl. No.: 14/446,622

(22) Filed: Jul. 30, 2014

(65) Prior Publication Data
US 2014/0342474 A1 Nov. 20, 2014

Related U.S. Application Data

(63) Continuation of application No. 13/536,418, filed on Jun. 28, 2012, now Pat. No. 8,822,240.

(30) Foreign Application Priority Data

Jul. 13, 2011 (JP) .................................. 2011-154941
Apr. 17, 2012 (JP) .................................. 2012-093663

(51) Int. Cl.
| | | |
|---|---|---|
| *G01R 31/26* | (2014.01) | |
| *H01L 21/66* | (2006.01) | |
| *H01L 21/67* | (2006.01) | |
| *G01K 1/12* | (2006.01) | |
| *G01K 7/02* | (2006.01) | |
| *G01K 7/04* | (2006.01) | |
| *C23C 16/02* | (2006.01) | |
| *G01K 13/02* | (2006.01) | |

(52) U.S. Cl.
CPC ............ *H01L 22/10* (2013.01); *C23C 16/0209* (2013.01); *G01K 1/12* (2013.01); *G01K 7/026* (2013.01); *G01K 7/04* (2013.01); *G01K 13/02* (2013.01); *H01L 21/67248* (2013.01); *H01L 22/30* (2013.01); *G01K 2013/024* (2013.01); *H01L 2924/0002* (2013.01)

(58) Field of Classification Search
CPC ... H01L 22/10; H01L 21/67248; H01L 22/30; G01K 1/12; G01K 7/026; G01K 7/04; G01K 13/02; C23C 16/0209
See application file for complete search history.

(56) References Cited

FOREIGN PATENT DOCUMENTS

| | | |
|---|---|---|
| JP | A 2002-164291 | 6/2002 |
| JP | A 2003-23062 | 1/2003 |
| JP | A 2004-296532 | 10/2004 |
| JP | A 2004-311712 | 11/2004 |
| JP | A 2009-117618 | 5/2009 |

*Primary Examiner* — Stephen W Smoot
*Assistant Examiner* — Vicki B Booker
(74) *Attorney, Agent, or Firm* — Oliff PLC

(57) ABSTRACT

A temperature detecting apparatus is provided which is capable of suppressing disconnection of a thermocouple wire or positional deviation of a thermocouple junction portion caused by change over time. The temperature detecting apparatus includes: an insulation rod installed to extend in a vertical direction and including a through-hole in vertical direction; a thermocouple wire inserted in the through-hole of the insulation rod, the thermocouple wire including a thermocouple junction portion at an upper end thereof and an angled portion at a lower end of the insulation rod; and a buffer area installed below the insulation rod and configured to suppress a restriction of a horizontal portion of the angled portion upon heat expansion, wherein an upper portion of the thermocouple wire or a middle portion in the vertical direction are supported by the insulation rod.

19 Claims, 22 Drawing Sheets

FIG. 8
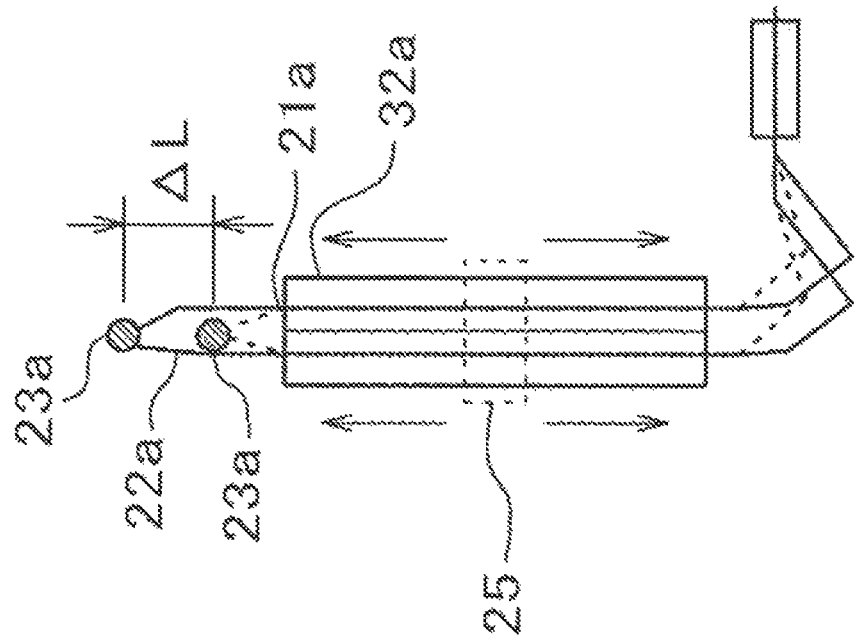
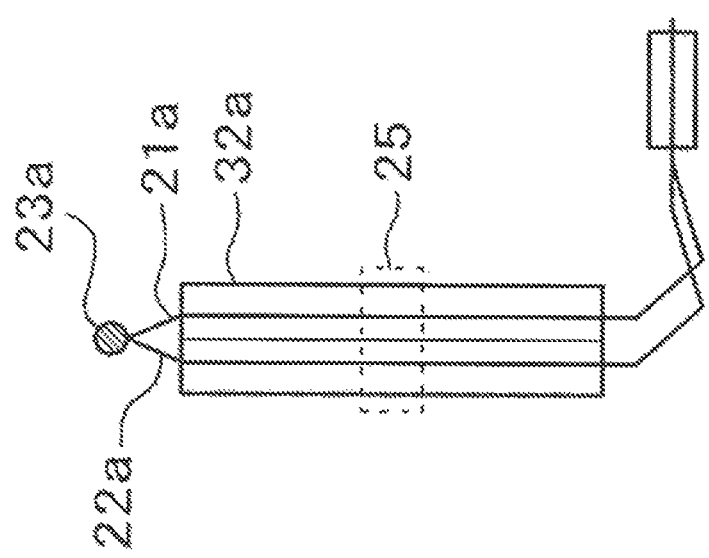

<Prior Art>

<Prior Art>

TEMPERATURE DETECTING APPARATUS, SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application is a continuation application of U.S. patent application Ser. No. 13/536,418 (issued as U.S. Pat. No. 8,822,240) filed Jun. 28, 2012 and claims priority under 35 U.S.C. §119 of Japanese Patent Application No. 2011-154941 filed on Jul. 13, 2011 and Japanese Patent Application No. 2012-093663 on Apr. 17, 2012, in the Japanese Patent Office, the entire contents of which are hereby incorporated by reference.

BACKGROUND OF THE INVENTION

1. Field of the Invention

The present invention relates to a heat treatment technique by which a substrate to be processed is accommodated in a processing chamber and processing is performed in a heated state by a heater. For example, the present invention relates to a temperature detecting apparatus, a substrate processing apparatus and a method of manufacturing a semiconductor device, which are used for performing heat treatment on a semiconductor substrate (for example, a semiconductor wafer) on which a semiconductor integrated circuit device (hereinafter referred to as "IC") is fabricated, such as oxidation processing or diffusion processing, or reflow processing or annealing processing for activation or planarization of a carrier after ions have been implanted, or film forming processing by thermal chemical vapor deposition (CVD) reaction.

2. Description of the Related Art

In manufacturing an IC, a batch type vertical heat treatment apparatus is widely used in order to heat-treat a substrate. In a processing furnace of the heat treatment apparatus of the related art, a boat on which a plurality of wafers are mounted is inserted from a lower portion thereof in a vertical reaction tube of a substantially cylindrical shape with its upper end closed and its lower end open and the wafers disposed on the boat are heat-treated by a heater installed so as to surround an outside of the reaction tube. The plurality of wafers are in a horizontal posture on the boat, and stacked and held in a multi-stage at a state aligned to a center of each wafer. A soaking tube of a substantially cylindrical shape with its upper end closed and its lower end open is installed between the reaction tube and the heater. The soaking tube is formed uniformly so that heat radiated form the heater to the wafer does not vary depending on a position.

A temperature detecting tube for detecting a temperature is installed between the soaking tube and the reaction tube, and an output of the heater, that is, a temperature of the wafer is controlled to a predetermined temperature based on a temperature detected by the temperature detecting tube. A thermocouple, which is a temperature detection device, is inserted into an inside of the temperature detecting tube and the thermocouple is connected to a temperature control portion through a signal line. In a vertical heat treatment furnace including a reaction tube and a heater, a technique of installing a thermocouple for detecting a temperature of the processing furnace has been disclosed (see Japanese Patent Unexamined Application No. 2009-117618).

A method of installing a thermocouple in the related art will be described with reference to FIGS. 12 to 15. FIG. 12 is a diagram illustrating a structure of a thermocouple of the related art, and the thermocouple between a reaction tube and a soaking tube is viewed from a center of a processing furnace. FIG. 13 is a cross-sectional view taken along line A-A of FIG. 12, and a horizontal sectional view of the thermocouple. FIG. 14 is a vertical sectional view viewed from the side of the thermocouple of FIG. 12. FIG. 15 is a diagram illustrating a support state of a thermocouple of the related art. In an example of FIG. 12, there are five thermocouples, that is, a first thermocouple including a thermocouple junction portion 423a, a second thermocouple including a thermocouple junction portion 423b, a third thermocouple including a thermocouple junction portion 423c, a fourth thermocouple including a thermocouple junction portion 423d, and a fifth thermocouple including a thermocouple junction portion 423e. The first thermocouple and the fourth thermocouple are inserted into a protection tube 431a, the second thermocouple and the fifth thermocouple are inserted into a protection tube 431b, and the third thermocouple is inserted into a protection tube 431c.

The first thermocouple is for temperature detection of an uppermost heater (U zone heater) of the processing furnace, the second thermocouple is for temperature detection of a heater (CU zone heater) immediately below the U zone heater, the third thermocouple is for temperature detection of a heater (C zone heater) immediately below the CU zone heater, the fourth thermocouple is for temperature detection of a heater (CL zone heater) immediately below the C zone heater, and the fifth thermocouple is for temperature detection of a lowermost heater (L zone heater) of the processing furnace.

As shown in FIG. 13, which is a cross-sectional view taken along line A-A of FIG. 12, the fourth thermocouple is located at the front (a central side of the processing furnace) in the protection tube 431a, and the first thermocouple is located at the rear. In addition, the fifth thermocouple is located at the front in the protection tube 431b and the second thermocouple is located at the rear. The cross section of an insulation rod 432a of the first thermocouple is elliptical, two holes penetrate through the cross section, and a thermocouple wire 421a of a plus side and a thermocouple wire 422a of a minus side are each inserted and accommodated into the two holes. Insulation rods 432b to 432e of the second thermocouple to the fifth thermocouple are also the same. The thermocouple wire is a wire part of the thermocouple that converts a temperature to a thermal electromotive force.

The first thermocouple is configured to include the thermocouple wire 421a of the plus side and the thermocouple wire 422a of the minus side, the thermocouple junction portion 423a in which the thermocouple wire 421a and the thermocouple wire 422a are jointed at a front end portion thereof, the insulation rod 432a for insulating the thermocouple wire 421a and the thermocouple wire 422a from each other, and a cap 434a for closing an upper end of the insulation rod 432a.

FIG. 14 is a side view of the first thermocouple. As shown in FIG. 14, in the thermocouple wire 421a and the thermocouple wire 422a (the thermocouple wire 422a is not shown), an inside of a soaking tube 221 extends in a vertical direction, and the thermocouple junction portion 423a is installed on upper ends thereof. In order to avoid a short circuit, the thermocouple wire 421a and the thermocouple wire 422a are each accommodated in the two holes of the insulation rod 432a. The cap 434a is installed on the upper end of the insulation rod 432a so as to seal the thermocouple junction portion 423a. The insulation rod 432a is inserted into the protection tube 431a, and the lower portion of the protection tube 431a is fixed by a protection tube holder 436. In addition, the lower portion of the insulation rod 432a extending in the vertical direction is in contact with the insulation rod 433a extending in the horizontal direction, and the insulation rod 433a is fixed by the protection tube holder 436. The thermocouple wire 421a and the thermocouple wire 422a, which pass through the inside of the insulation rod 432a in the vertical direction, turn 90° from the lower end of the insulation rod 432a and pass through the inside of the insulation rod 433a in a horizontal direction to be connected to a temperature control portion (not shown).

Similar to the first thermocouple, the second thermocouple is configured to include a thermocouple wire 421b of a plus side and a thermocouple wire 422b of a minus side, the thermocouple junction portion 423b in which the thermocouple wire 421b and the thermocouple wire 422b are jointed at a front end portion thereof, the insulation rod 432b for insulating the thermocouple wire 421b and the thermocouple wire 422b from each other, and a cap 434b for closing an upper end of the insulation rod 432b. The third thermocouple is configured to include a thermocouple wire 421c of a plus side and a thermocouple wire 422c of a minus side, the thermocouple junction portion 423c in which the thermocouple wire 421c and the thermocouple wire 422c are jointed at a front end portion thereof, the insulation rod 432c for insulating the thermocouple wire 421c and the thermocouple wire 422c from each other, and a cap 434c for closing an upper end of the insulation rod 432c. The fourth thermocouple is configured to include a thermocouple wire 421d of a plus side and a thermocouple wire 422d of a minus side, the thermocouple junction portion 423d in which the thermocouple wire 421d and the thermocouple wire 422d are jointed at a front end portion thereof, the insulation rod 432d for insulating the thermocouple wire 421d and the thermocouple wire 422d from each other, and a cap 434d for closing an upper end of the insulation rod 432d. The fifth thermocouple is configured to include a thermocouple wire 421e of a plus side and a thermocouple wire 422e of a minus side, the thermocouple junction portion 423e in which the thermocouple wire 421e and the thermocouple wire 422e are jointed at a front end portion thereof, the insulation rod 432e for insulating the thermocouple wire 421e and the thermocouple wire 422e from each other, and a cap 434e for closing an upper end of the insulation rod 432e.

In addition, as shown in FIG. 15, in the related art, a thermocouple wire 421 of a plus side and a thermocouple wire 422 of a minus side are fixed by a thermocouple wire support portion 424 disposed therebelow. More specifically, the thermocouple wire 421 and the thermocouple wire 422 are bent to have an L shape in an L-shaped portion including an insulation rod 432 and an insulation rod 433. Accordingly, the lower portions of the thermocouple wire 421 and the thermocouple wire 422 are substantially fixed in the vertical direction. In addition, the thermocouple wires 421a to 421e are collectively referred to as the thermocouple wire 421, the thermocouple wires 422a to 422e as the thermocouple wire 422, the thermocouple junction portions 423a to 423e as the thermocouple junction portion 423, the insulation rods 432a to 432e as the insulation rod 432, the insulation rods 433a to 433e as the insulation rod 433, and the caps 434a to 434e as the cap 434.

FIG. 16 is a diagram illustrating an expansion and contraction state of a thermocouple of the related art, FIG. 16a represents a standby state (500° C.) before heat treatment, FIG. 16b represents a process state (1200° C.) during heat treatment, and FIG. 16c represents a standby state (500° C.) after heat treatment. When the standby state of FIG. 16a comes to the heat treatment state of FIG. 16b, the thermocouple wires 421 and 422 and the insulation rod 432 are heat-expanded, and the thermocouple wires protrude from the upper end of the insulation rod 432, such that the thermocouple wires 421 and 422 are lengthened by $\Delta L$. Since the protrusion amount $\Delta L$ is determined by an expansion difference between the thermocouple wires 421 and 422 and the insulation rod 432, an insulation rod material of a small expansion difference is selected. When the heat treatment state of FIG. 16b comes to the standby state of FIG. 16c, the thermocouple wires 421 and 422 are heat contracted, such that the thermocouple wires 421 and 422 are shortened by $\Delta L$ to thus return to an original length.

When heat expansion and heat contraction are repeated, a displacement or entanglement in grain boundaries of the thermocouple wire 421 or 422 occurs due to a self-weight of the thermocouple wire 421 or 422, or a change over time such as a frictional force with the insulation rod 432. The displacement of grain boundaries means that crystal grains of the thermocouple wire 421 or 422 are bloated by heat treatment, and thus grain boundaries between adjacent grains are deviated by stress due to the heat expansion and heat contraction. FIG. 17 is a diagram illustrating a state in which a thermocouple of the related art is broken, FIG. 17a illustrates a standby state, and FIG. 17b illustrates heat treatment state. When the standby state of FIG. 17a and the heat treatment state of FIG. 17b are repeated, a wire deformation portion 411 is generated, for example, because the thermocouple wire 422 is stretched, and a frictional force with the insulation rod 432 is increased. In addition, the insulation rod 432 is spaced upwardly from the insulation rod 433. In addition, when changes progress over time, as shown in FIG. 17c, during the heat contraction, a binding force in which the thermocouple wire 422 is bound to the insulation rod 432 become stronger, and thus tensile stress to the thermocouple wire 421 increases. Eventually, the tensile strength of the thermocouple wire 422 becomes excessive, and thus the thermocouple wire 421 is disconnected in a disconnection portion 412.

In addition, in the thermocouple installing method of the related art, as described above, since the lower portion of the thermocouple wire 421 or 422 is fixed, the position of the thermocouple junction portion 423, that is, the temperature measurement position is significantly changed by the heat expansion of the thermocouple wire 421 or 422. For example, when a length of the thermocouple wire is 1,500 mm and an ambient temperature is about 1,200° C., the temperature measurement position is shifted by about 19 mm. For this reason, accurate temperature measurement is difficult, and appropriate temperature control is not easy.

SUMMARY OF THE INVENTION

It is an object of the present invention to provide a temperature detecting apparatus or a substrate processing apparatus capable of suppressing disconnection of a thermocouple wire or positional deviation of a thermocouple junction portion caused by change over time.

According to one aspect of the present invention, there is provided a temperature detecting apparatus including: an insulation rod installed to extend in a vertical direction and including a through-hole in vertical direction; a thermocouple wire inserted in the through-hole of the insulation rod, the thermocouple wire including a thermocouple junction portion at an upper end thereof and an angled portion at a lower end of the insulation rod; and a buffer area installed below the insulation rod and configured to suppress a restriction of a horizontal portion of the angled portion upon heat expansion, wherein an upper portion of the thermocouple wire or a middle portion in the vertical direction are supported by the insulation rod.

According to the configuration, disconnection of a thermocouple wire or positional deviation of a thermocouple junction portion caused by change over time can be suppressed.

BRIEF DESCRIPTION OF THE DRAWINGS

FIG. 8 is a diagram illustrating an expansion and contraction state of the thermocouple in the second embodiment of the present invention;

DETAILED DESCRIPTION OF THE PREFERRED EMBODIMENTS

First Embodiment of the Present Invention

Figure 1:
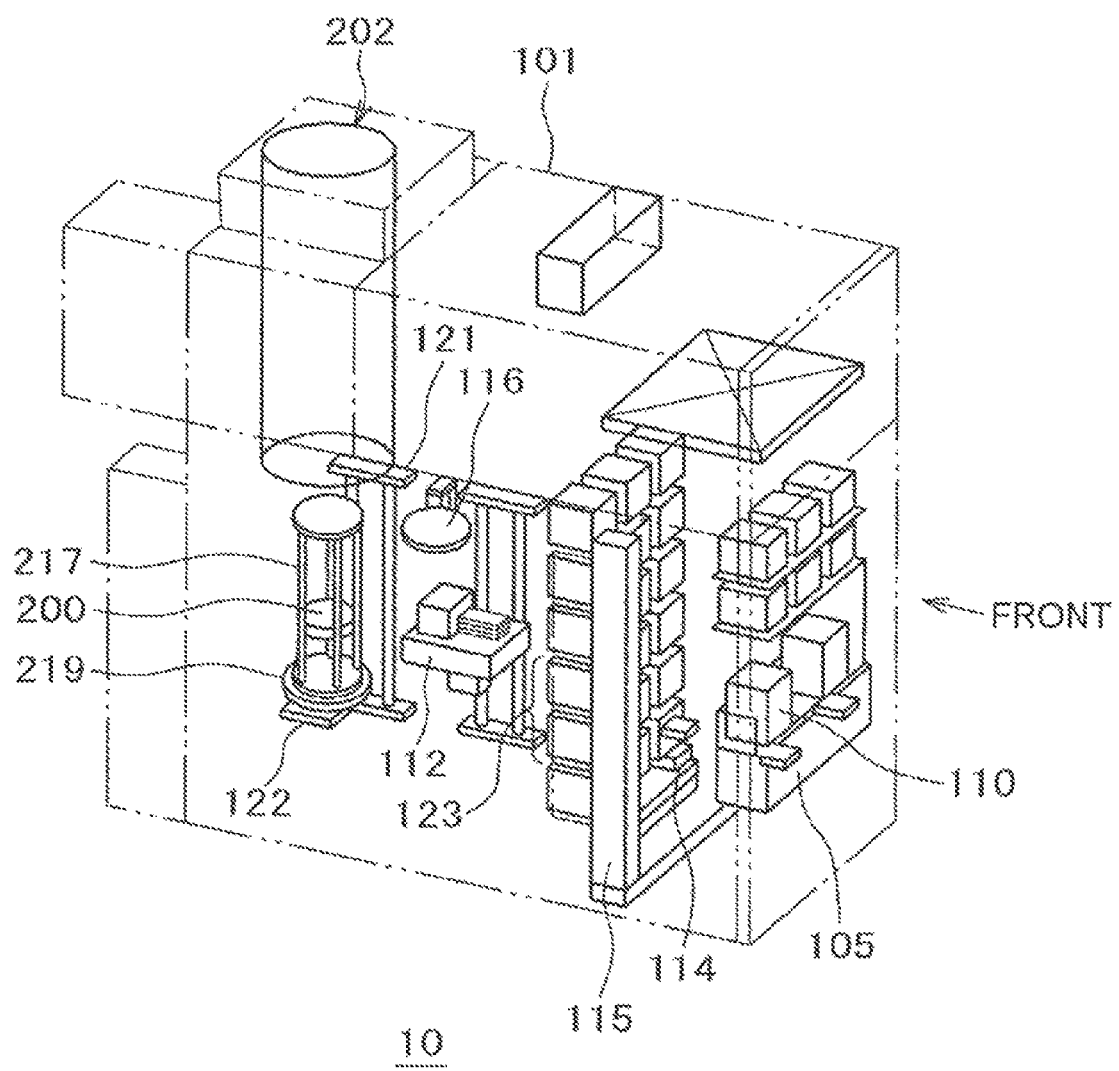
FIG. 1 is an oblique perspective view of a substrate processing apparatus in an embodiment of the present invention.

In the first embodiment of the present invention, as one process in manufacturing processes of a semiconductor device (such as an IC), a configuration example of a substrate processing apparatus that performs a substrate processing process by heat treatment will be described with reference to FIG. 1. FIG. 1 is an oblique perspective view of a substrate processing apparatus in first to fourth embodiments of the present invention. As shown in FIG. 1, a substrate processing apparatus 10 according to each embodiment of the present invention includes a housing 101. In addition, in each embodiment of the present invention, in order to transfer a wafer 200, which is a substrate formed of silicon, into and out of the housing 101, a cassette 110 is used as a wafer carrier (substrate accommodating unit).

A cassette stage 105 is installed on a front side of the housing 101. The cassette 110 is loaded and placed on the cassette stage 105, and unloaded from the cassette stage 105 to the outside of the housing 101, by a transfer device (not shown) in a process outside the housing. A cassette shelf 114 is substantially installed at an approximately central portion in the housing 101 in the front to rear direction. The cassette shelf 114 stores a plurality of cassettes 110. A transfer shelf 123, which is a part of the cassette shelf 114, is installed, and the cassette 110, which is a transfer target of a wafer transfer mechanism 112 to be described later, is accommodated on the transfer shelf 123. The cassette transfer device 115 is installed between the cassette stage 105 and the cassette shelf 114. The cassette transfer device 115 transfers the cassette 110 among the cassette stage 105, the cassette shelf 114 and the transfer shelf 123.

The wafer transfer mechanism 112 is installed at a rear of the cassette shelf 114. The wafer transfer mechanism 112 accommodates the wafer 200 in the cassette 110 on the transfer shelf 123 by charging the wafer 200 in a boat 217 (substrate holding unit) to be described later, or discharging the wafer 200 from the boat 217 after the wafer 200 is picked up from the cassette 110 on the transfer shelf 123.

A processing furnace 202 is installed at a rear upper part of the housing 10. A lower end portion of the processing furnace 202 is configured to be closed and opened by a furnace throat shutter 116. A configuration of the processing furnace 202 will be described later. A boat elevator 115 is installed at a lower part of the processing furnace 202 as an elevating mechanism to transport the boat to the inside or the outside of the processing furnace 202 by elevating the boat 217. An arm 122 is installed as an elevating stand on the boat elevator 121. A seal cap 219 is installed on the arm 122 in a horizontal posture. The seal cap 219 supports the boat 217 in a vertical direction and functions as a cover for tightly closing the lower end portion of the processing furnace 202 when the boat 217 is elevated by the boat elevator 121. A configuration of the boat 217 will be described later.

(Configuration of Processing Furnace)

Figure 2:
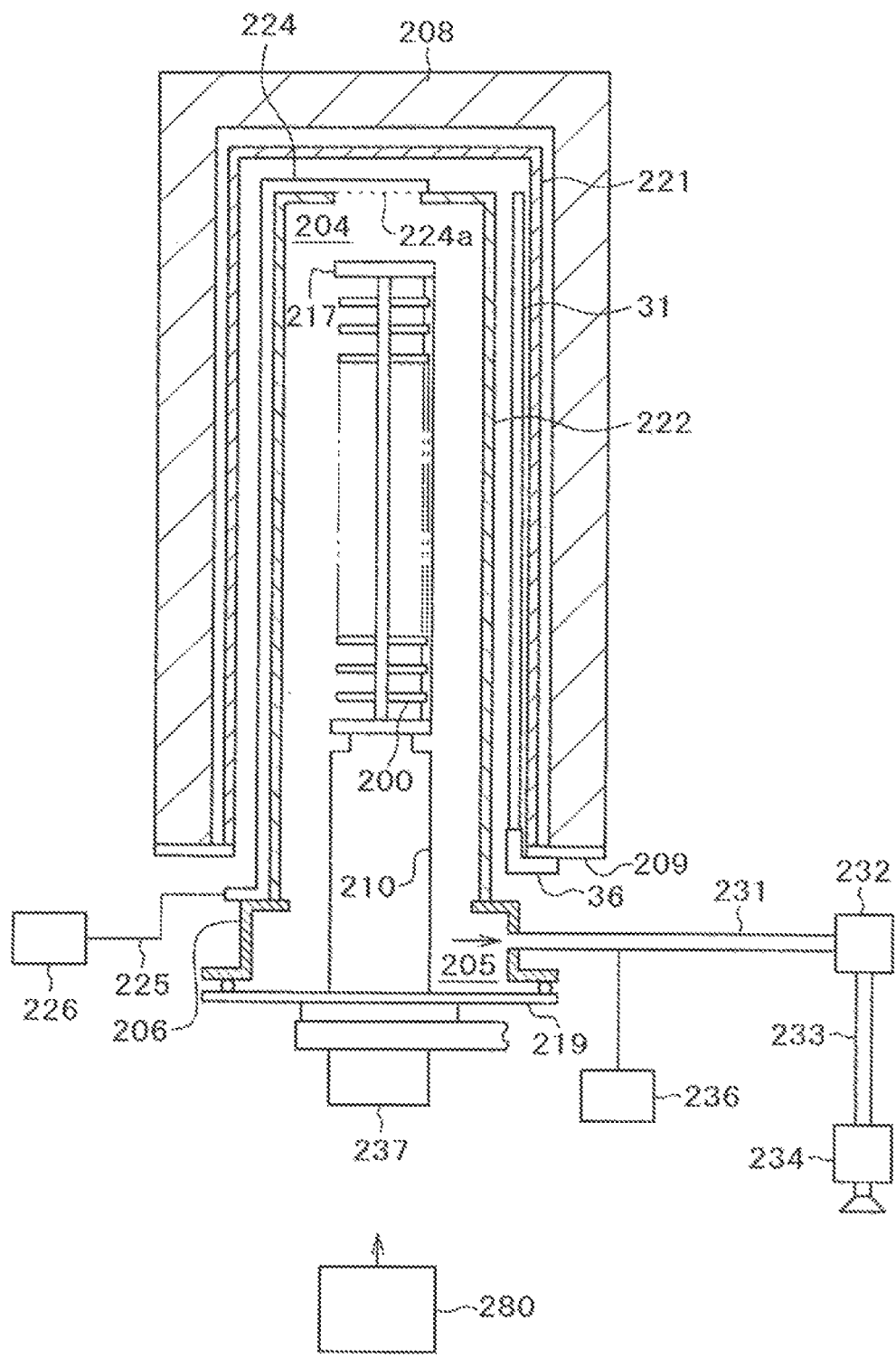
FIG. 2 is a vertical sectional view of a processing furnace in an embodiment of the present invention.

Subsequently, a configuration of the processing furnace 202 according to the first to fourth embodiments of the present invention will be described with reference to FIG. 2. FIG. 2 is a vertical sectional view of a processing furnace of a substrate processing apparatus. In this embodiment, the processing furnace 202 is configured as a heat treatment furnace having a batch type vertical hot wall form.

(Reaction Tube and Soaking Tube)

The processing furnace 202 includes a vertical type reaction tube 222 at the inside of thereof. The reaction tube 222 has a substantially cylindrical shape with its upper end closed and its lower end open, and is disposed in a vertical direction so that the opened lower end faces the lower portion and the central line of the cylindrical direction is vertical. A processing chamber 204 is disposed in the reaction tube 222 to process a plurality of wafers 200 by accommodating the wafers 200, which are stacked in a multi-stage in the horizontal posture by the boat 217 as a substrate holding unit. An inner diameter of the reaction tube 222 is set to be larger than a maximum outer diameter of the boat 217 holding a group of the wafers 200. In this example, the reaction tube 222 is integrally molded in a substantially cylindrical shape of a material having high heat resistance such as quartz ($SiO_2$) or silicon carbide (SiC).

A soaking tube 221, which is to uniformize heat radiated form a heater unit 208 to be described later to the reaction tube 222, is installed on the outside of the reaction tube 222. The soaking tube 221 has a substantially cylindrical shape with its upper end closed and its lower end open, and is disposed in a vertical direction so that the opened lower end faces the lower portion and the central line of the cylindrical direction is vertical, similar to the reaction tube 222. The soaking tube 221 is larger than the reaction tube 222 and has a shape substantially similar to the reaction tube 222 to cover the reaction tube 222 concentrically so as to surround the outside of the reaction tube 222. The lower end portion of the soaking tube 221 is supported by a base 209 made of a metal material that is a part of the housing 101. In this example, the soaking tube 221 is integrally molded in a substantially cylindrical shape of a material having high heat resistance such as quartz ($SiO_2$) or silicon carbide (SiC).

The lower end portion of the reaction tube 222 is tightly sealed by a manifold 206 in which a horizontal cross section has a substantially circular ring shape. For maintenance work and cleaning work, the reaction tube 222 is detachably installed on the manifold 206. Since the manifold 206 is supported by the housing 101, the reaction tube 222 is installed in the housing 101 in the vertical direction. A lower end opening of the manifold 206 constitutes a furnace throat 205 for inserting or removing the boat 217 holding the group of the wafers 200.

(Substrate Holding Unit)

The manifold 206 is in contact with a seal cap 29 for closing the lower end opening of the manifold 206 from a vertical lower part. The seal cap 219 is formed in a disk shape having an outer diameter equal to or greater than that of the reaction tube 222 and configured to be elevated in the vertical direction, while the disk shape is maintained in the horizontal posture by the boat elevator 121 installed on the outside of the reaction tube 222 in the vertical direction. The boat 217 as the substrate holding unit holding the wafers 200 is supported on the seal cap 219 in the vertical direction. The boat 217 includes a pair of top and bottom end plates and a plurality of, in this example, three, wafer holding members (boat prop) installed across both of the plates in the vertical direction. The end plates and the wafer holding members are made of a material having high heat resistance such as quartz ($SiO_2$) or silicon carbide (SiC), for example.

A plurality of holding grooves engraved in the horizontal direction are installed in each wafer holding member at regular intervals across the longitudinal direction. Each wafer holding member is installed such that holding grooves are opposite to each other and vertical positions (vertical direction position) of the holding groove of each wafer holding member are matched. The peripheries of the wafer 200 are inserted into the holding grooves of the same stage in the plurality of wafer holding members and thus, the plurality of wafers 200 (for example, about 50 to 150) are in a horizontal posture and stacked and held in a multi-stage and in a vertical direction in a state in which centers of the wafers are aligned each other.

In addition, a heat insulating cylinder 210 is installed between the boat 217 and the seal cap 219. The heat insulating cylinder 210 is made of a material having high heat resistance such as quartz ($SiO_2$) or silicon carbide (SiC), for example.

By the heat insulating cylinder 210, heat transferred from the heater unit 208 to the manifold 206 side can be suppressed, as described later.

A boat rotation mechanism 237 rotating the boat 217 is installed on a lower part (on the opposite side of the processing chamber 204) of the seal cap 219. A boat rotating shaft of the boat rotation mechanism 237 supports the boat 217 from a lower portion thereof through the seal cap 219. By rotating the boat rotating shaft, the wafers 200 can rotate in the processing chamber 204. The seal cap 219 is configured to be elevated by the above-described boat elevator 121 in the vertical direction, and thus the boat 217 can be transferred to the inside and outside of the processing chamber 204. The boat rotation mechanism 237 and the boat elevator 121 are electrically connected to a control unit 280. The control unit 280 controls the boat rotation mechanism 237 and the boat elevator 121 so as to perform a desired operation at a desired timing.

(Heater Unit)

The heater unit 208, as a heating mechanism which entirely heats the inside of the reaction tube 222 uniformly or at a predetermined temperature distribution, is installed on the outside of the soaking tube 221 to surround the soaking tube 221. The heater unit 208 is vertically installed by being supported on the housing 101 of the substrate processing apparatus 10, for example, configured to include a resistance heating heater such as a carbon heater.

(Temperature Detecting Apparatus)

A protection tube 31, which protects a built-in thermocouple of a temperature measuring device, is installed to extend between the soaking tube 221 and the reaction tube 222 in a vertical direction. The lower end of the protection tube 31 is supported and fixed by a protection tube holder 36. The protection tube 31 has a cylindrical shape and is made of a material having high heat resistance such as silicon carbide (SIC) to a length of about 1,500 mm and an outer diameter of about 8 mm, and the upper end thereof can be closed and the lower end includes an opening portion. An insulation rod that accommodates the thermocouple wire is inserted through the opening portion. Thus, the thermocouple wire is configured not to be spread by pollutant from the insulation rod or the thermocouple, while being exposed to corrosive gas. The insulation rod or the thermocouple wire will be described later. The protection tube holder 36 is made of alumina or stainless and the like and includes a vertical part that supports the protection tube 31, and a horizontal part into which a thermocouple wire is inserted and guided to the outside of the processing chamber 204.

Atmospheric air is circulated through a space between the soaking tube 221 and the reaction tube 222 and the space is tightly separated from the inside of the processing chamber 204. In addition, the space is configured as a structure in which the processing gas does not penetrate into the space and air in the space between the soaking tube 221 and the reaction tube 222 does not penetrate into the processing chamber 204. The heater unit 208 and thermocouple are electrically connected to the control unit. The control unit 280 controls electric power to the heater unit 208, such that a temperature of the inside of the processing chamber 204 may be distributed at a desired timing and a desired temperature based on a temperature detected by thermocouple.

Figure 3:
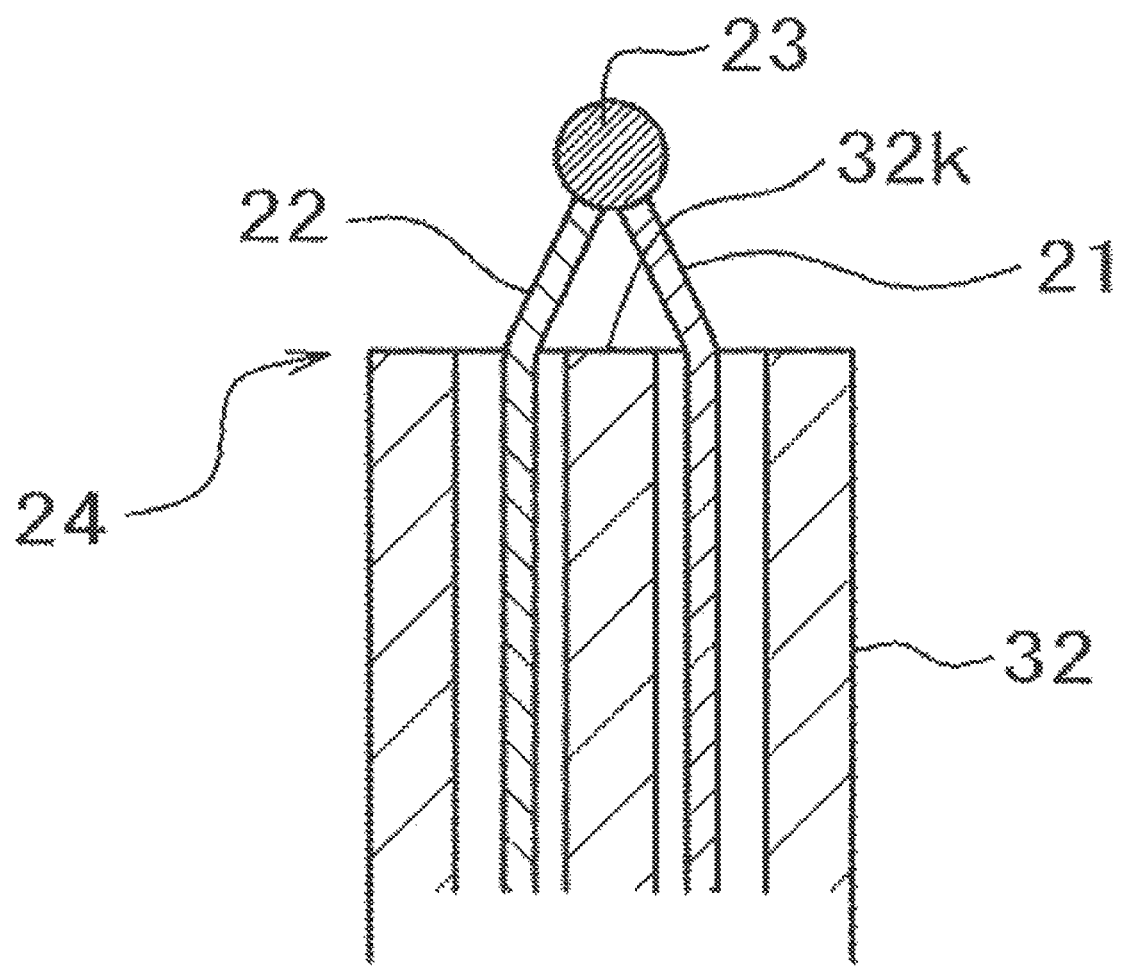
FIG. 3 is a diagram illustrating a support state of a thermocouple in a first embodiment of the present invention.

In the first embodiment, as shown in FIG. 3, the thermocouple wire 21 and the upper end of the thermocouple wire 22 are supported in the thermocouple wire support portion 24. FIG. 3 is a diagram illustrating a support state of a thermocouple in a first embodiment of the present invention. The thermocouple wire support portion 24 is an upper end 32k of a wall portion between two through-holes installed in an insulation rod 32 to be descried later in order for the thermocouple wires 21 and 22 to pass therethrough. In addition, even upon heat expansion, a lower portion of the thermocouple wire is maintained in a free state in which the lower portion is not bound. By this configuration, upon heat expansion, since the thermocouple wire 21 and the thermocouple wire 22 can maintain a linear shape by a self-weight, partially bending or receiving a binding force can be suppressed. As a result, a large frictional force generated between the thermocouple wires 21 and 22 and the insulation rod 32 can be suppressed. This configuration will be described in detail below.

Figure 4:
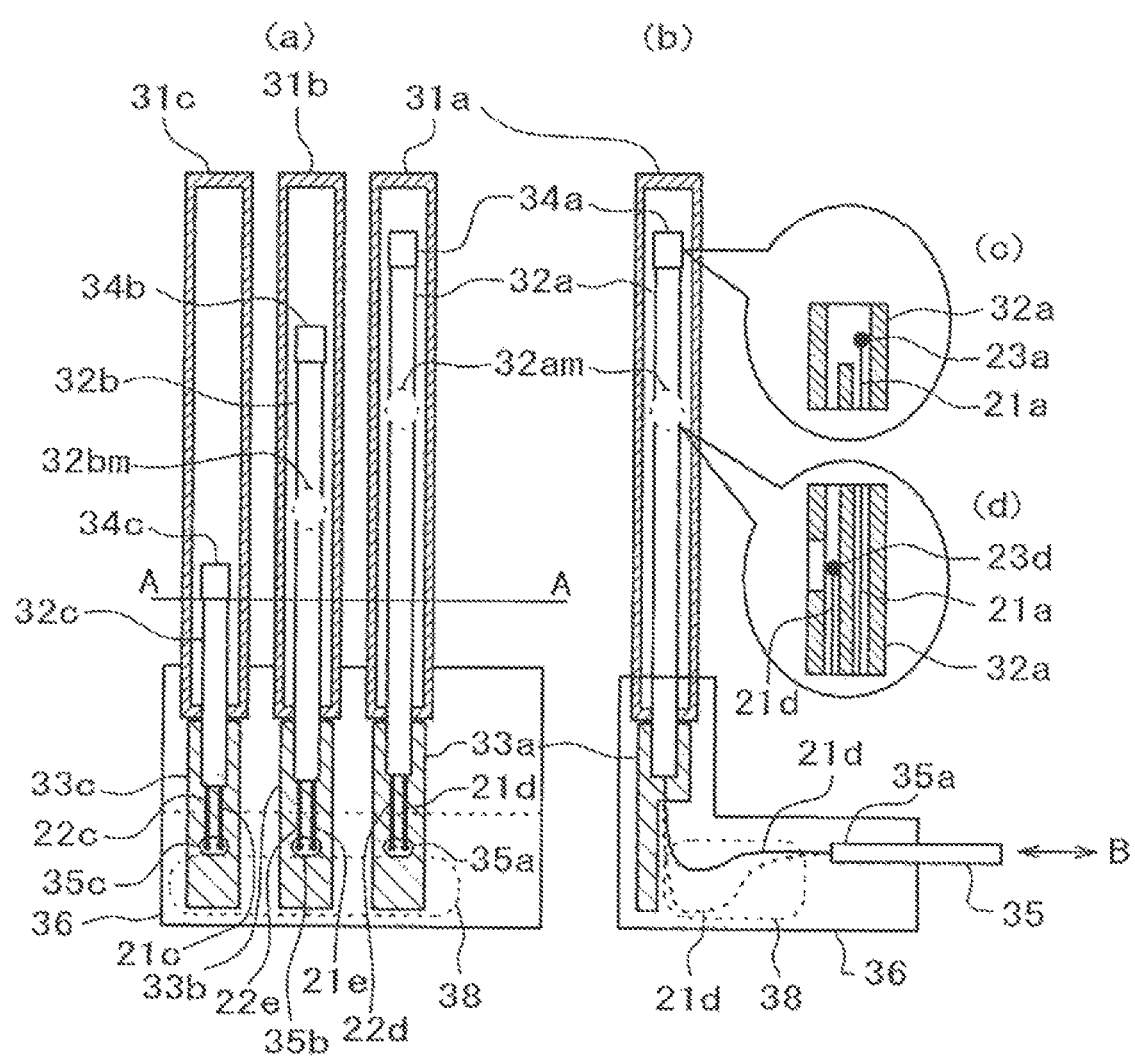
FIG. 4 is a diagram illustrating a structure of the thermocouple in the first embodiment of the present invention.
Figure 5:
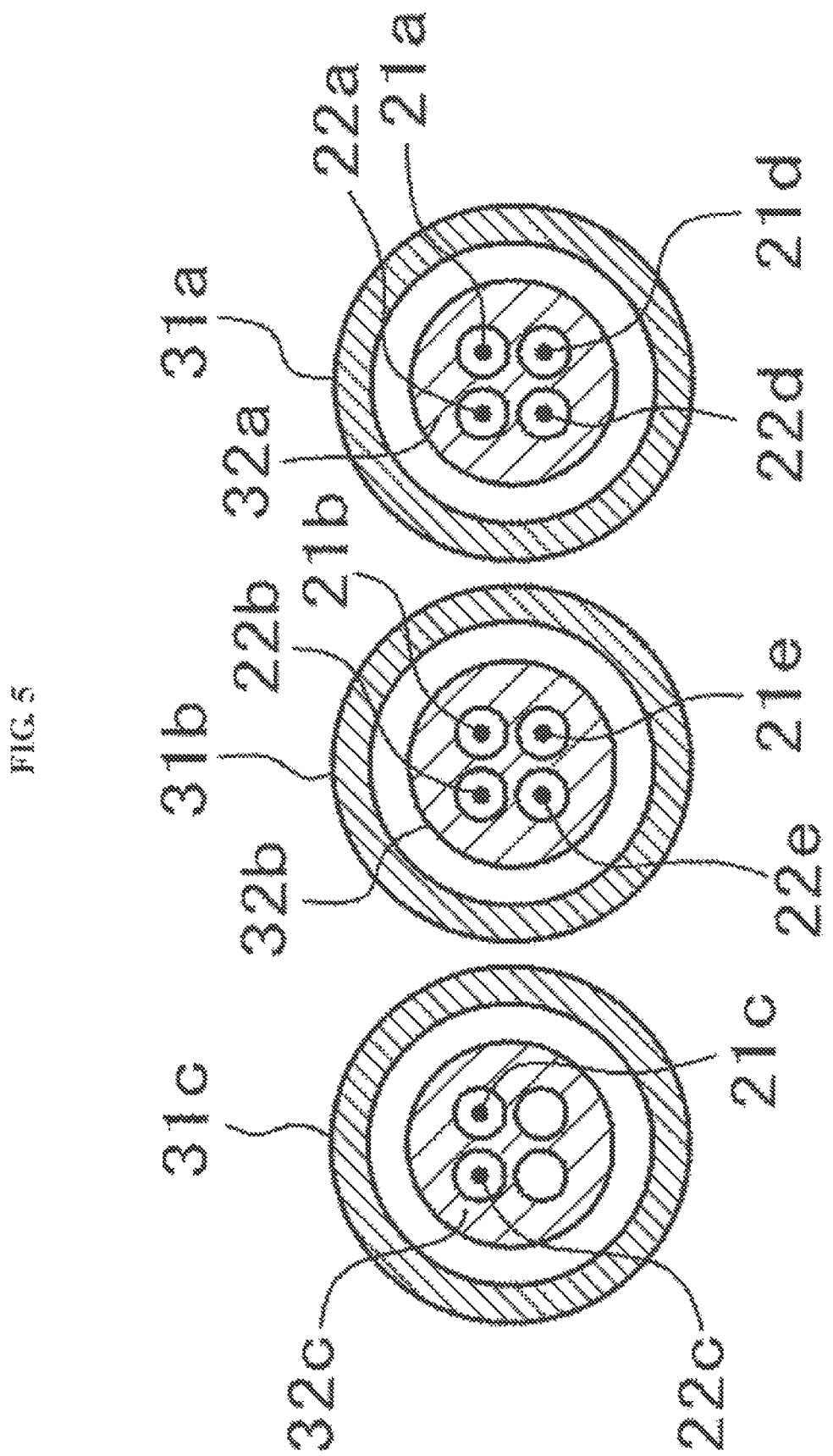
FIG. 5 is a horizontal sectional view of the thermocouple of FIG. 4.

FIG. 4 is a diagram illustrating a structure of a temperature detecting apparatus in the first embodiment of the present invention. FIG. 4a is a diagram in which a thermocouple between a reaction tube and a soaking tube is viewed from a center of the processing furnace. FIG. 4b is a vertical cross-sectional view of the temperature detecting apparatus of FIG. 4a from a side thereof. FIG. 5 is a horizontal sectional view taken along A-A of FIG. 4. In the first embodiment, as shown in FIG. 4a, there are three protection tubes of the thermocouple, that is, a protection tube 31a, a protection tube 31b, and a protection tube 31c. A lower end of each protection tube is supported by the protection tube holder 36. More specifically, the protection tube holder 36 is fixed to the substrate processing apparatus 10 of the housing 101 through a part, and the protection tube 31 is inserted and fixed thereinto to be held upright.

In addition, the thermocouple wire 21 of a plus side and the thermocouple wire 22 of a minus side are accommodated, and the insulation rod 32 for insulating the thermocouple wires 21 and 22 from each other is inserted in each protection tube 31 one by one. As shown in FIGS. 4a and 4b, the lower end of the insulation rod 32 is inserted and supported in the insulation rod stopper 33. The lower end of the insulation rod stopper 33 is supported by a bottom portion of the protection tube holder 36. Materials of the insulation rod 32 and the insulation rod stopper 33 are, for example, alumina. Materials of the thermocouple wire 21 of the plus side and the thermocouple wire 22 of the minus side are, for example, a platinum-rhodium alloy and platinum, respectively.

In addition, protection tubes 31a to 31c are collectively referred to as the protection tube 31. Meanwhile, as described later, thermocouple wires 21a to 21e are collectively referred to as the thermocouple wire 21, thermocouple wires 22a to 22e as the thermocouple wire 22, thermocouple junction portions 23a to 23e as the thermocouple junction portion 23, insulation rods 32a to 32c as the insulation rod 32, insulation rod stoppers 33a to 33c as the insulation rod stopper 33, and caps 34a to 34c as the cap 34.

In the first embodiment, the thermocouple is disposed on five zone heaters of the processing furnace, respectively. The first thermocouple is for temperature detection of the uppermost heater (U zone heater) of the processing furnace, the second thermocouple is for temperature detection of the heater (CU zone heater) immediately below the U zone heater, the third thermocouple is for temperature detection of the heater (C zone heater) immediately below the CU zone heater, the fourth thermocouple is for temperature detection of the heater (CL zone heater) immediately below the C zone heater, and the fifth thermocouple is for temperature detection of the lowermost heater (L zone heater) of the processing furnace.

The first temperature detecting apparatus including the first thermocouple is configured to include the thermocouple wire 21a of the plus side and the thermocouple wire 22a of the minus side, the thermocouple junction portion 23a in which the thermocouple wire 21a and the thermocouple wire 22a are jointed at the front end portion thereof, the insulation rod 32a for insulating the thermocouple wires 21a and 22a from each other, the cap 34a for closing the upper end of the insulation rod 32a, the insulation rod stopper 33a, the protection tube 31a, and the protection tube holder 36. The second temperature detecting apparatus including the second thermocouple is configured to include a thermocouple wire 21b of the plus side and a thermocouple wire 22b of the minus side, a thermocouple junction portion 23b in which the thermocouple wire 21b and the thermocouple wire 22b are jointed at the front end portion thereof, an insulation rod 32b for insulating the thermocouple wires 21b and 22b from each other, a cap 34b for closing the upper end of the insulation rod 32b, an insulation rod stopper 33b, the protection tube 31b, and the protection tube holder 36. The third temperature detecting apparatus including the third thermocouple is configured to include a thermocouple wire 21d of the plus side and a thermocouple wire 22d of the minus side, a thermocouple junction portion 23d in which the thermocouple wires 21d and 22d are jointed at the front end portion thereof, the insulation rod 32a for insulating the thermocouple wires 21d and 22d from each other, the cap 34a for closing the upper end of the insulation rod 32a, the insulation rod stopper 33a, the protection tube 31a, and the protection tube holder 36. The fourth temperature detecting apparatus including the fourth thermocouple is configured to include a thermocouple wire 21e of the plus side and a thermocouple wire 22e of the minus side, the thermocouple junction portion 23d in which the thermocouple wires 21e and 22e are jointed at the front end portion thereof, the insulation rod 32b for insulating the thermocouple wires 21e and 22e from each other, the cap 34b for closing the upper end of the insulation rod 32b, the insulation rod stopper 33b, the protection tube 31b, and the protection tube holder 36. The fifth temperature detecting apparatus including the fifth thermocouple is configured to include a thermocouple wire 21c of the plus side and a thermocouple wire 22c of the minus side, a thermocouple junction portion 23c in which the thermocouple wires 21c and 22c are jointed at the front end portion thereof, the insulation rod 32c for insulating the thermocouple wires 21c and 22c from each other, the cap 34c for closing the upper end of the insulation rod 32c, the insulation rod stopper 33c, the protection tube 31c, and the protection tube holder 36.

Referring to FIG. 4a, the thermocouple junction portion 23a for the first thermocouple is disposed at a position of the cap 34a of a front end of the insulation rod 32a, the thermocouple junction portion 23b for the second thermocouple is disposed at a position of the cap 34b of a front end of the insulation rod 32b, the thermocouple junction portion 23d for the third thermocouple is disposed at a position of the middle of the insulation rod 32a, the thermocouple junction portion 23e for the fourth thermocouple is disposed at a position of the middle of the insulation rod 32b, and the thermocouple junction portion 23c for the fifth thermocouple is disposed at the position of the cap 34c of the front end of the insulation rod 32c.

As shown in FIG. 4 or 5, the insulation rod 32a is inserted in the protection tube 31a. The insulation rod 32b is inserted in the protection tube 31b. The insulation rod 32c is inserted in the protection tube 31c. In the protection tube holder 36, the lower end of the insulation rod 32a is supported by the insulation rod stopper 33a, the lower end of the insulation rod 32b is supported by the insulation rod stopper 33b, and the lower end of the insulation rod 32c is supported by the insulation rod stopper 33c.

As shown in FIG. 5, the cross section of the insulation rod 32a is circular, four holes penetrate the cross section, and the thermocouple wires 21a and 22a for the first thermocouple and the thermocouple wires 21d and 22d for the third thermocouple are inserted and accommodated in the four holes. In addition, the cross section of the insulation rod 32b is circular, four holes penetrate the cross section, and the thermocouple wires 21b and 22b for the second thermocouple and the thermocouple wires 21e and 22e for the fourth thermocouple are inserted and accommodated in the four holes. In addition, the cross section of the insulation rod 32c is circular, four holes penetrate the cross section, and the thermocouple wires 21c and 22c for the fifth thermocouple are inserted and accommodated in the two holes of the four holes.

As shown in FIG. 5, which is a cross sectional view taken along line A-A of FIG. 4a, the third thermocouple is located at the front (a central side of the processing chamber 204) in the insulation rod 32a, and the first thermocouple is located at the rear. In addition, the fourth thermocouple is located at the front in the insulation rod 32b and the second thermocouple is located at the rear.

FIG. 4b is a side view of the protection tube 31a or protection tube holder 36 and is also a side view of the first thermocouple and the third thermocouple. FIG. 4c is a vertical cross-sectional enlarged view near the thermocouple junction portion 23a of the first thermocouple located on the upper end of the insulation rod 32a. FIG. 4d is a vertical cross-sectional enlarged view near the thermocouple junction portion 23d of the third thermocouple located on a middle of the upper and lower ends of the insulation rod 32a. As shown in FIG. 4c, in the thermocouple wire 21a and the thermocouple wire 22a (the thermocouple wire 22a is not shown), an inside of the insulation rod 32a extends in the vertical direction and the thermocouple junction portion 23a is installed on the upper end. A portion of the insulation rod 32a in which the thermocouple junction portion 23a is installed has a cylindrical shape that leaves only an outer periphery of the insulation rod 32a and the thermocouple junction portion 23a is supported by an upper end (corresponding to 32k of FIG. 3) of a wall portion of the insulation rod 32a at a boundary between a hole for the thermocouple wire 21a and a hole for the thermocouple wire 22a.

In addition, as shown in FIG. 4d, in the thermocouple wire 21d and the thermocouple wire 22d (the thermocouple wire 22d is not shown), an inside of the insulation rod 32a extends in the vertical direction, and the thermocouple junction portion 23d is installed in a middle portion of the insulation rod 32a located at the upper end thereof. A portion of the insulation rod 32a in which the thermocouple junction portion 23d is installed has a shape in which a part of the outer periphery of the insulation rod 32a and a boundary between a hole for the thermocouple wire 21d and a hole for the thermocouple wire 22d are removed. The thermocouple junction portion 23d is supported by an upper end (corresponding to 32k of FIG. 3) of a wall portion of the insulation rod 32a at a boundary between a hole for the thermocouple wire 21d and a hole for the thermocouple wire 22d. The part of the outer periphery of the insulation rod 32a described above is a portion facing a center side of the processing chamber 204.

As shown in FIG. 4b, other ends of the thermocouple wire 21a and the thermocouple wire 22a and other ends of the thermocouple wire 21d and the thermocouple wire 22d are output from the lower end of the insulation rod 32a in the vertical direction and inserted into the wire holding portion 35 in the horizontal direction to be connected to a temperature control portion (not shown) other than the processing chamber 204 in the protection tube holder 36 of a hollow structure.

The thermocouple wires are covered with heat resistant insulating tubes (for example, a tube made of ceramic fiber or glass fiber, etc.) up to about 800° C. in the protection tube holder 36 and thus are isolated from each other. In addition, FIG. 4b illustrates only the thermocouple wire 21d. However, since the thermocouple wires 22d, 21a and 22a or the thermocouple wires 21b, 22b, 21e and 22e within the insulation rod 32b, or the thermocouple wires 21c and a 22c also are the same as the thermocouple wire 21d, hereinafter, the thermocouple wire 21d will be described below.

After the thermocouple wire 21d is output below from the lower end of the insulation rod 32a in the vertical direction, the thermocouple wire 21d is changed in the horizontal direction, and is input from one end 35a of the wire holding portion 35 (a central side of the processing chamber 204) to the wire holding portion 35. A distance from the one end 35a to the bottom portion of the protection tube holder 36 ranges from 10 mm to 15 mm. In addition, a buffer area 38 in which the thermocouple wire 21d is not bound to the protection tube holder 36 upon heat expansion is formed in the protection tube holder 36. A state in which the thermocouple wire 21d is not bound to the protection tube holder 36 means, for example, a state in which the thermocouple wire 21d does not come into a bottom portion of the protection tube holder 36 upon heat expansion, or force leading to disconnection is not applied to the bottom portion even when in contact with the bottom portion. The insulation rod stopper 33 supports the bottom portion of the insulation rod 32 at a position higher than the buffer area 38, that is, at a position higher than one end 35a of the wire holding portion 35. Accordingly, a wider buffer area can be easily obtained. The insulation rod stopper 33a may be configured such that the inside thereof is penetrated in the vertical direction, and the thermocouple wire 21d from the lower end of the insulation rod 32a is guided to the buffer area 38 through the through-hole. Thus, the thermocouple wire can easily maintain the linear shape in the vertical direction, and the binding force received from the insulation rod stopper can be suppressed.

Accordingly, a position 35a of the wire holding portion 35 input by the thermocouple wire 21d and a position of the lower end of the insulation rod 32 output by the thermocouple wire 21d are set to be equal to or greater than about 10 mm from the bottom portion of the protection tube holder 36. That is, it is supported at a position higher than the buffer area 38 upon heat expansion. The thermocouple wire 21d is in contact with the bottom portion of the protection tube holder 36 and binding of a force leading to disconnection can be suppressed. In FIG. 4b, within the buffer area 38, the thermocouple wire 21d is indicated by a solid line in a standby state (500° C.) before and after the heat treatment, and the thermocouple wire 21d is indicated by dashed line in a process state (1,200° C.) during the heat treatment.

In addition, the thermocouple wire 21d is fixed by a ceramic adhesive in the wire holding portion 35. This is to be provided such that the thermocouple wire 21d in the buffer area 38 does not to pull from the outside of the processing chamber 204.

As described above, the thermocouple junction portion 23 is supported at the upper end or the middle portion of the insulation rod 32, the insulation rod 32 is supported by the insulation rod stopper 33, and the insulation rod stopper 33 is supported by the protection tube holder 36. That is, the upper ends of the thermocouple wires 21 and 22 are supported by the insulation rod 32 or the like. In addition, in the thermocouple wires 21 and 22, a portion output from the lower end of the insulation rod 32 is in state in which it is not bound to the bottom portion or the like of the protection tube holder 36 in the buffer area 38. Therefore, upon heat expansion, the thermocouple wires 21 and 22 can maintain the linear shape by a self-weight, and partial bending can be suppressed. As a result, a large frictional force generated between the thermocouple wires 21 and 22 and the insulation rod 32 can be suppressed and disconnection of the thermocouple wires 21 and 22 can be suppressed. In addition, a linear expansion coefficient of the insulation rod 32 is adopted to be smaller than those of the thermocouple wires 21 and 22 and thus a change in the position, that is, a change in a temperature measurement position, of the thermocouple junction portion 23 due to heat expansion can be reduced to be smaller than that of the related art. For example, a linear expansion coefficient of the insulation rod 32 is $8.1 \times 10^{-4}/^\circ$ C., a linear expansion coefficient of the thermocouple wire 21 is $10.2 \times 10^{-4}/^\circ$ C., and a linear expansion coefficient of the thermocouple wire 22 is $10.6 \times 10^{-4}/^\circ$ C.

(Gas Supply System)

A gas supply system will be described with reference to FIG. 2. As shown in FIG. 2, a gas nozzle 224 that supplies a processing gas into the processing chamber 204 is installed along a side wall of the reaction tube 222 and an opening portion 224a is installed at an upper portion of the reaction tube 222. A processing gas supply pipe 225 is connected to the gas nozzle 224. A processing gas supply unit 226 is connected to the processing gas supply pipe 225. The processing gas supply unit 226 includes a processing gas supply source that supplies the processing gas, a mass flow controller (MFC) as a flow control device, and an opening and closing valve, in order from an upstream side. The processing gas supply unit is mainly configured to include the gas nozzle 224, the processing gas supply pipe 225, and the processing gas supply unit 226. The MFC or opening and closing valve of the processing gas supply unit 226 is electrically connected to the control unit 280. The control unit 280 controls the MFC and the opening and closing valve such that a type of gas to be supplied into the processing chamber 204 may be supplied as a desired gas species at a desired timing, and flow to be supplied becomes a desired flow at a desired timing.

(Gas Exhaust System)

An exhaust pipe 231 that exhausts an atmosphere from an inside of the processing chamber 204 is connected to a part of a side wall of a manifold 206. A pressure sensor 236, as a pressure detector, and an auto pressure controller (APC) valve 232, as a pressure regulator, are installed in the exhaust pipe 231 in order from an upstream side. A vacuum pump 234 is connected to downstream of the APC valve 232 through an exhaust pipe 233 as a vacuum exhaust device. An exhaust portion that exhausts gas from the reaction tube 222 is mainly configured to include the exhaust pipe 231, the APC valve 232, and the vacuum pump 234. The APC valve 232 and the pressure sensor 236 are electrically connected to the control unit 280. The control unit 280 controls an opening degree of the APC valve 232 such that a pressure within the processing chamber 204 becomes a desired pressure at a desired timing, based on pressure values detected by the pressure sensor 236.

(Controller)

A control unit 280 includes an operation portion or an input and output portion, which is not shown, and is electrically connected to each configuration portion of a substrate processing apparatus 10 to control each configuration portion of the substrate processing apparatus 10. The control unit 280 commands temperature control or pressure control, flow control and mechanical driving control based on a recipe that represents a control sequence of a process such as a film forming process on a time axis.

(Substrate Processing Operation According to this Embodiment)

Figure 22:
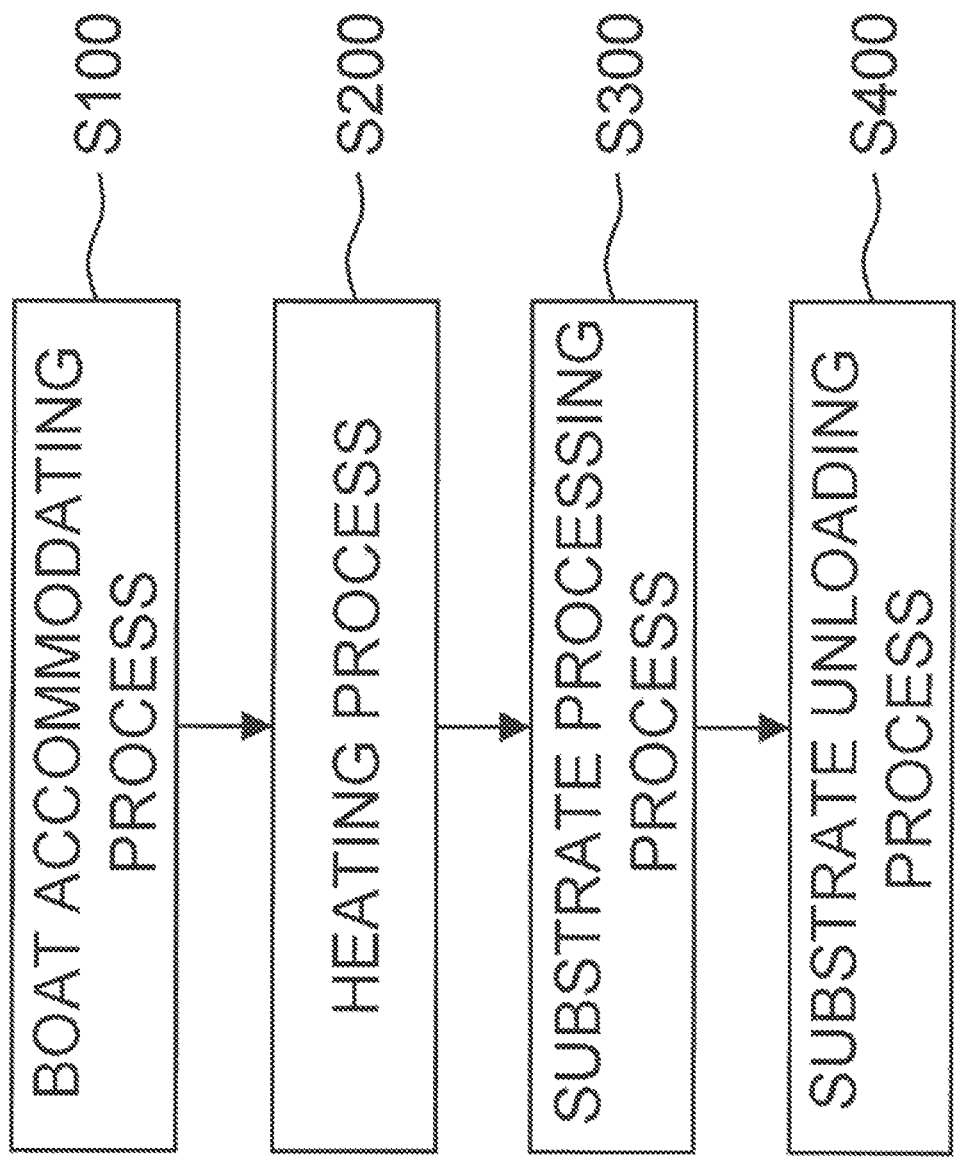
FIG. 22 is an exemplary flowchart of a method of manufacturing a semiconductor substrate device or a substrate processing method according to the present invention.

Next, a substrate processing operation according to the embodiment of the present invention will be described as an example of a film forming process. FIG. 22 is an exemplary flowchart of a method of manufacturing a semiconductor substrate device or a substrate processing method according to the present invention. The substrate processing operation is controlled by a controller 280. First, in wafer charging, wafers 200 are loaded into a boat 217. A plurality of wafers 200 are loaded and aligned in parallel with each other horizontally and in a multi-stage with their centers aligned while being charged in the boat 217. Next, in a boat loading step, a boat 217 that loads and holds the plurality of wafers 200 are transported (boat loading) in the processing chamber 204 (boat accommodating process, S100 of FIG. 22).

Subsequently, in a reduced pressure step, a pressure of an inside of a reaction tube 222 is reduced to a predetermined vacuum degree by a vacuum pump 234 through the exhaust pipe 231, and in a raised temperature step, a temperature of the inside of the reaction tube 222 is elevated to a predetermined temperature by a heater unit 208, based on a temperature measured by a temperature detecting apparatus (heating process, S200 FIG. 22).

Next, in a film forming step, a predetermined source gas is supplied into a gas nozzle 224 and introduced into a processing chamber 204, while a boat 217 is rotated. A source gas introduced into the processing chamber 204 is flowed into the reaction tube 222, and exhausted through an exhaust pipe 231 opened to a manifold 206. Thus, film forming of surfaces of the wafers 200 is accomplished by the source gas flowing parallel to a space between the wafers 200 that adjoin up and down, while the source gas is in contacted with the surface of the wafers 200 (substrate processing process, S300 of FIG. 22).

After a desired film forming process is performed, supply of the source gas is stopped. In addition, after an inside of the processing chamber 204 is returned to an atmospheric pressure by an inert gas, a seal cap 219 is moved below and thus a lower end of the processing chamber 204 is opened, and a group of the wafers 200 processed in a state held in the boat 217 are transported (boat unloading) from the processing chamber 204 to the outside thereof, in a boat unloading step (substrate unloading process, S400 of FIG. 22).

According to the first embodiment, at least one of the following effects (1) to (7) can be obtained. (1) The thermocouple wire is supported at an upper portion thereof, and a buffer area is provided below the thermocouple wire. Thus, since a lower portion of the thermocouple wire is not bound by a bottom portion or the like of other members, for example, a protection tube holder, the thermocouple wire can maintain a linear shape by a self-weigh, partial bending can be suppressed, and disconnection of the thermocouple wire can be suppressed. (2) Since a height of a lower end of the insulation rod accommodating the thermocouple wire and a height of a wire holding portion fixing a portion of the thermocouple wire are set to be equal to or greater than 10 mm from a bottom portion of the protection tube holder, a sufficient buffer area can be easily provided below the thermocouple wire. (3) Since the lower end of the insulation rod accommodating the thermocouple wire is supported at a position higher than the wire holding portion fixing the portion of the thermocouple wire, a wider buffer area can be easily provided. (4) Since a through hole is provided at the insulation rod stopper in a vertical direction and the thermocouple wire passes into the through-hole, the thermocouple wire can easily maintain a linear shape in the vertical direction and a binding force received from the insulation rod stopper can be suppressed. (5) Since the thermocouple wire is fixed to the inside of the wire holding portion, the thermocouple wire within the buffer area can be prevented from tensile force being received from an outside of the processing chamber. (6) Since the lower end of the insulation rod accommodating the thermocouple wire is supported by the insulation rod stopper, and a lower end of the insulation rod stopper is supported at the bottom portion of the protection tube holder, the thermocouple wire does not need to be bonded to the insulation rod using an adhesive, and the upper portion of the thermocouple wire can be easily supported. (7) Since a cross section of the insulation rod is circular, four holes are configured to penetrate in the vertical direction, and the thermocouple wire for a plurality of thermocouple can be accommodated into the four holes, a diameter of the protection tube can be reduced.

Second Embodiment

Figure 6:
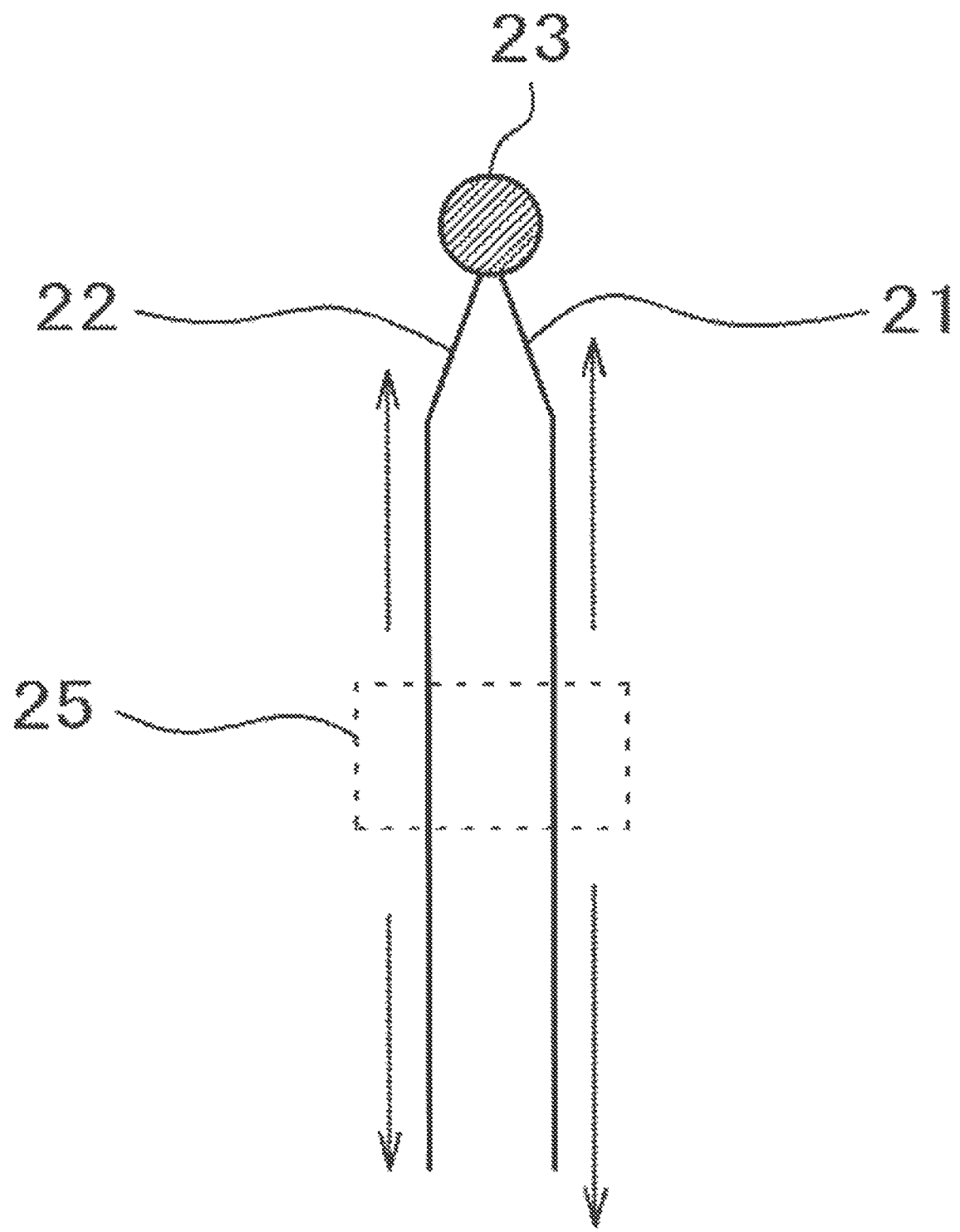
FIG. 6 is a diagram illustrating a support state of a thermocouple in a second embodiment of the present invention.

A configuration of a temperature detecting apparatus of a second embodiment of the present invention will be described with reference to FIGS. 6 to 8, in addition, since a configuration or processing operation other than the temperature detecting apparatus is the same as in the first embodiment, an explanation thereof will be omitted. As shown in FIG. 6, a thermocouple wire supporting portion 25 of the thermocouple extends in a vertical direction (up and down direction), that is, a supporting position 25 of the thermocouple wire is provided at a substantially middle portion of the thermocouple wire 21 and 22 in the vertical direction. FIG. 6 is a diagram illustrating a support state of a thermocouple in a second embodiment of the present invention. By this configuration, upon heat expansion, an effect that autonomously enhances linearity at a portion lower than the supporting position 25 can be obtained by a self-weight of the thermocouple wires 21 and 22, an increase in a frictional force with an insulation rod can be suppressed, and generation of an entanglement due to wire deformation according to a change over time can be suppressed. In addition, a distance from the supporting position 25 to a thermocouple junction point 23 is shortened at an upper portion of the thermocouple supporting position 25, and thus the self-weight of the thermocouple itself is reduced and the frictional force with the insulation rod is reduced. Thus, generation of entangled wire deformation due to change over time can also be suppressed. These configurations will be described in detail below.

Figure 7:
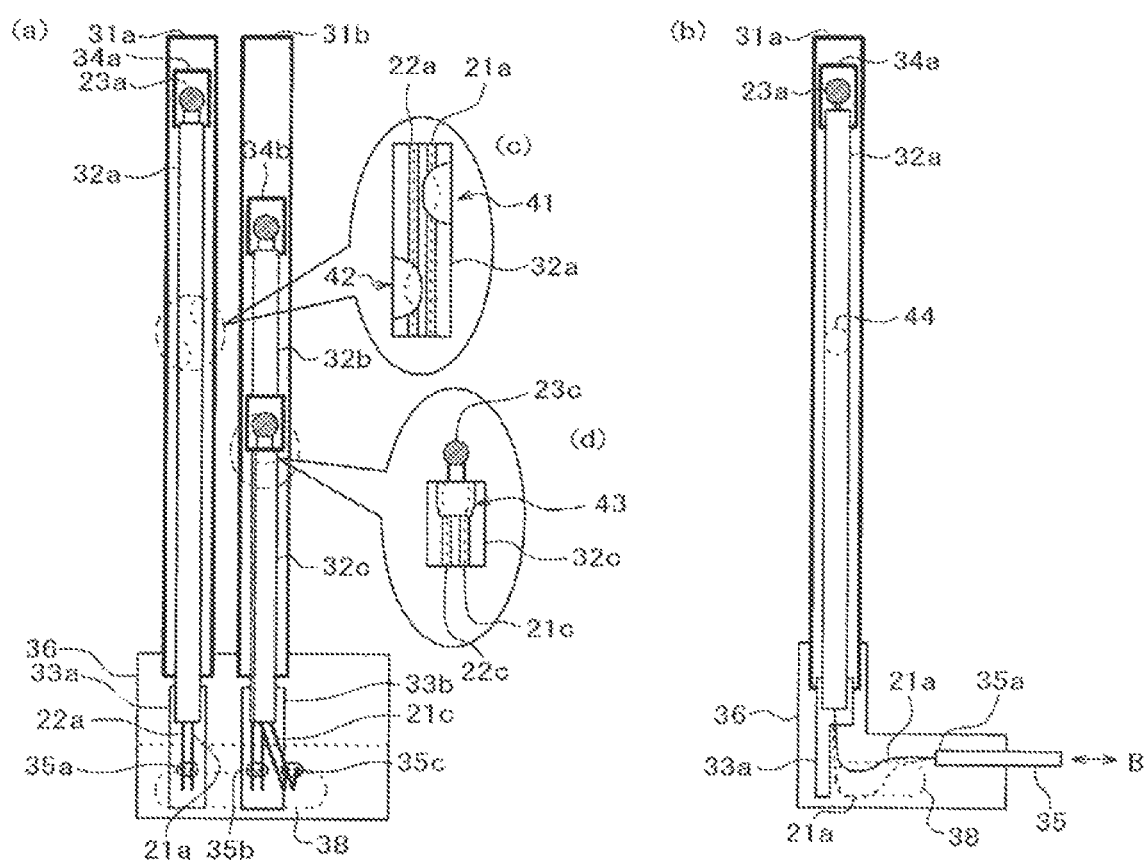
FIG. 7 is a diagram illustrating a structure of the thermocouple in the second embodiment of the present invention.

FIG. 7 is a diagram illustrating a structure of a temperature detecting apparatus in the second embodiment of the present invention. FIG. 7a is a diagram in which a thermocouple between a reaction tube and a soaking tube is viewed from a center of the processing furnace. FIG. 7b is a vertical cross-sectional view that views the temperature detecting apparatus of FIG. 7a from a side thereof. In the second embodiment, as shown in FIG. 7a, there are two protection tubes of the thermocouple, that is, a protection tube 31a and a protection tube 31b. A lower end of each protection tube is supported by a protection tube holder 36. Since a structure of the protection tube holder 36 or a structure in which the protection tube holder 36 supports the protection tube is the same as in the first embodiment, an explanation thereof will be omitted.

A thermocouple wire 21 of a plus side and a thermocouple wire 22 of a minus side are accommodated, and an insulation rod 32 for insulating the thermocouple wires 21 and 22 from each other is inserted in each protection tube 31. An insulation rod 32a is inserted in the protection tube 31a, and an insulation rod 32b and an insulation rod 32c are inserted in the protection tube 31b. As shown in FIGS. 7a and 7b, a lower end of the insulation rod 32a is inserted and supported in an insulation rod stopper 33a, and lower ends of the insulation rod 32b and the insulation rod 32c are inserted and supported in an insulation rod stopper 33b. Lower ends of the insulation rod stoppers 33a and 33b are supported by a bottom portion of the protection tube holder 36. Materials of the insulation rod 32, the insulation rod stopper 33 and the thermocouple wires 21 and 22 are identical to those in the first embodiment.

In addition, protection tubes 31a to 31b are collectively referred to as the protection tube 31. Meanwhile, as described later, thermocouple wires 21a to 21c are collectively referred to as the thermocouple wire 21, thermocouple wires 22a to 22 as the thermocouple wire 22, thermocouple junction portions 23a to 23c as the thermocouple junction portion 23, insulation rods 32a to 32c as the insulation rod 32, insulation rod stoppers 33a to 33b as the insulation rod stopper 33, and caps 34a to 34c as the cap 34.

In the second embodiment, the thermocouple is disposed on three zone heaters of the processing furnace. The first thermocouple is for temperature detection of the uppermost heater (U zone heater) of the processing furnace, the second thermocouple is for temperature detection of the heater (C zone heater) immediately below the U zone heater, and the third thermocouple is for temperature detection of the heater (L zone heater) immediately below the C zone heater.

The first temperature detecting apparatus including the first thermocouple is configured to include the thermocouple wire 21a of the plus side and the thermocouple wire 22a of the minus side, the thermocouple junction portion 23a in which the thermocouple wires 21a and 22a are jointed at the front end portion thereof, the insulation rod 32a for insulating the thermocouple wires 21a and 22a from each other, the cap 34a for closing the upper end of the insulation rod 32a, the insulation rod stopper 33a, the protection tube 31a, and the protection tube holder 36. The second temperature detecting apparatus including the second thermocouple is configured to include the thermocouple wire 21b of the plus side and the thermocouple wire 22b of the minus side, the thermocouple junction portion 23b in which the thermocouple wires 21b and 22b are jointed at the front end portion thereof, the insulation rod 32b for insulating the thermocouple wires 21b and 22b from each other, the cap 34b for closing the upper end of the insulation rod 32b, the insulation rod stopper 33b, the protection tube 31b, and the protection tube holder 36. The third temperature detecting apparatus including the third thermocouple is configured to include the thermocouple wire 21c of the plus side and the thermocouple wire 22c of the minus side, the thermocouple junction portion 23c in which the thermocouple wires 21c and 22c are jointed at the front end portion thereof, the insulation rod 32c for insulating the thermocouple wires 21c and 22c from each other, the cap 34c for closing an upper end of the insulation rod 32c, the insulation rod stopper 33b, the protection tube 31b, and the protection tube holder 36.

Referring to FIG. 7a, the thermocouple junction portion 23a for the first thermocouple is disposed at a position of the cap of a front end 34a of the insulation rod 32a, the thermocouple junction portion 23b for the second thermocouple is disposed at a position of the cap of a front end 34b of the insulation rod 32b, and the thermocouple junction portion 23c for the third thermocouple is disposed at the position of the cap of a front end 34c of the insulation rod 32c.

Figure 13:
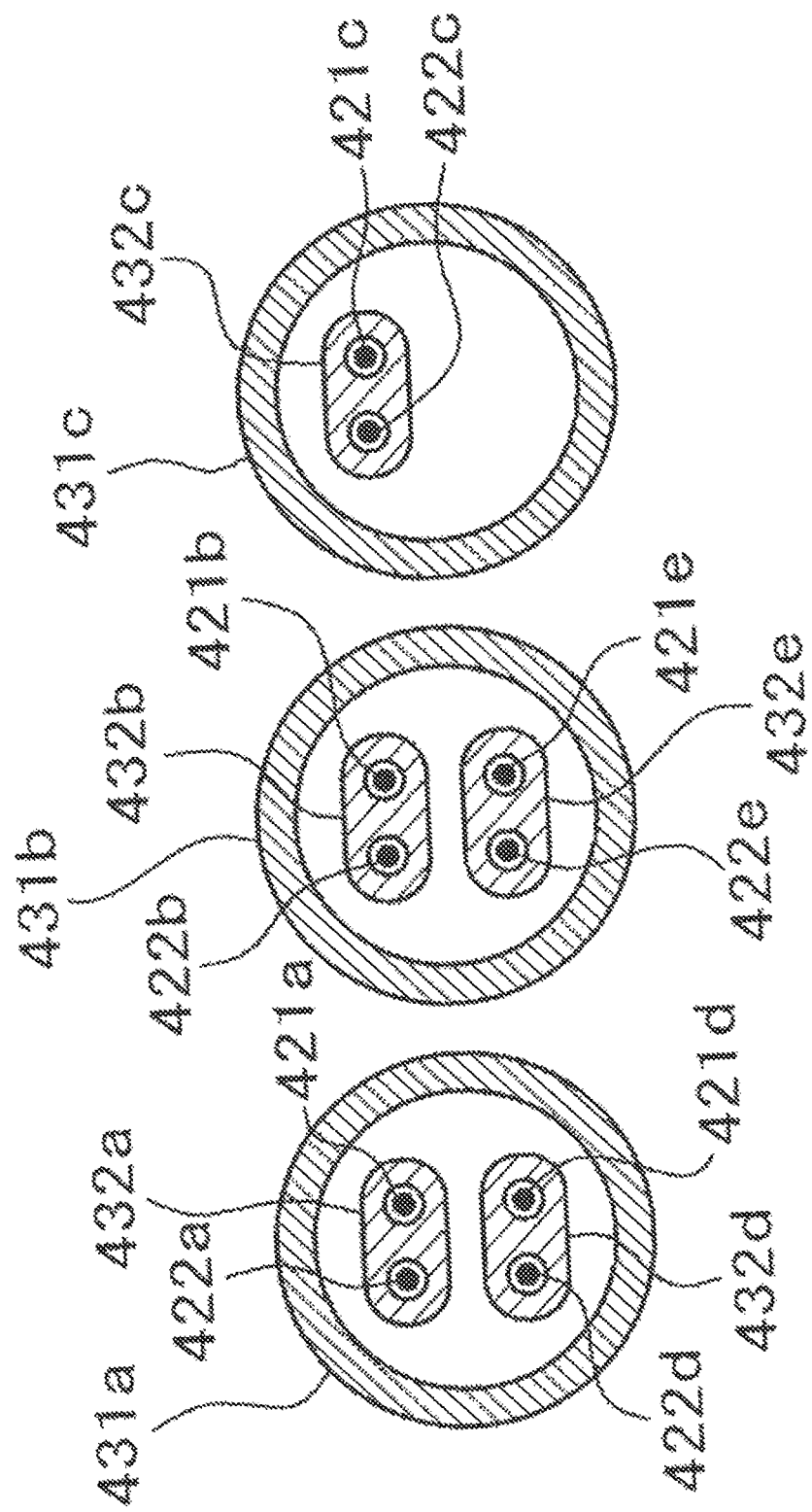
FIG. 13 is a horizontal sectional view of the thermocouple of FIG. 12.
Figure 14:
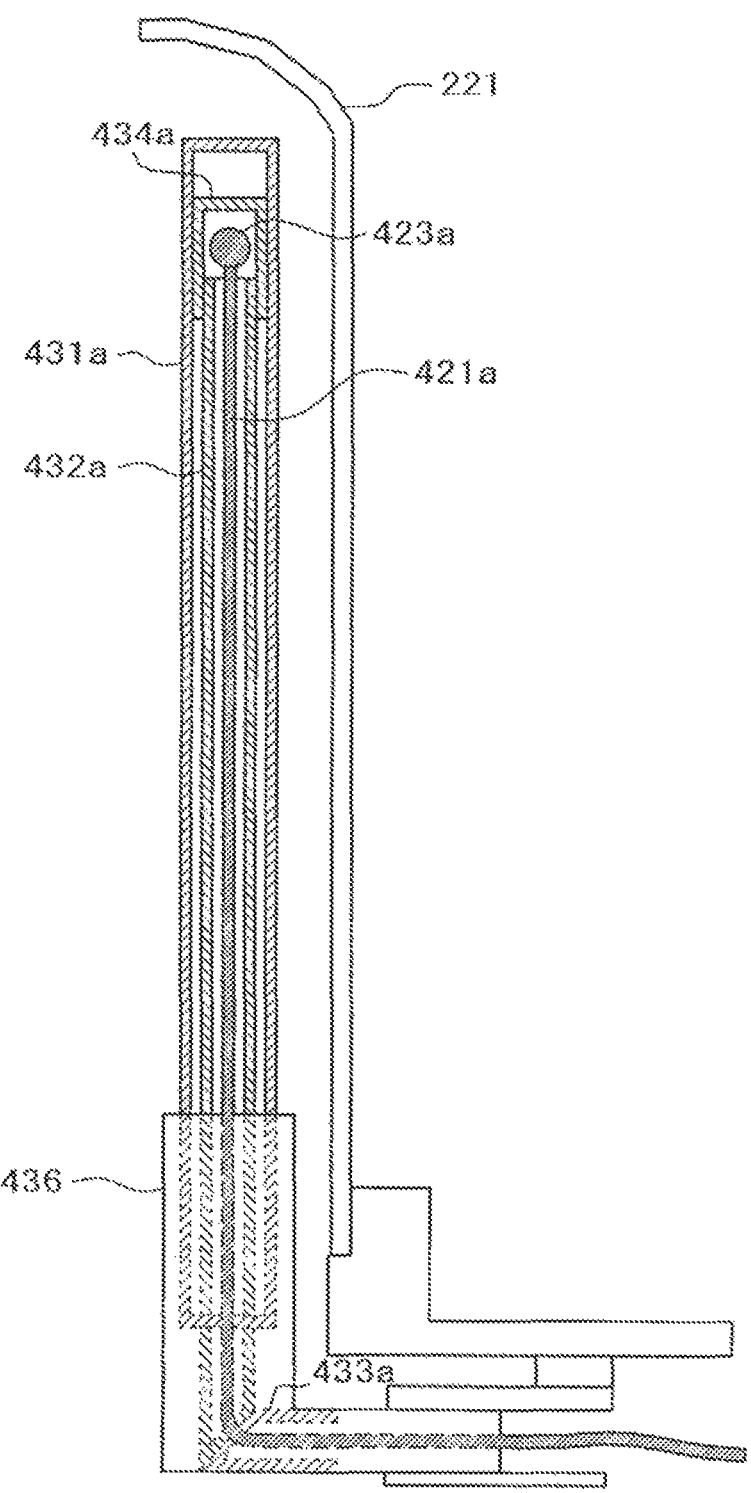
FIG. 14 is a vertical sectional view seen from a side of the thermocouple of FIG. 12.
Figure 15:
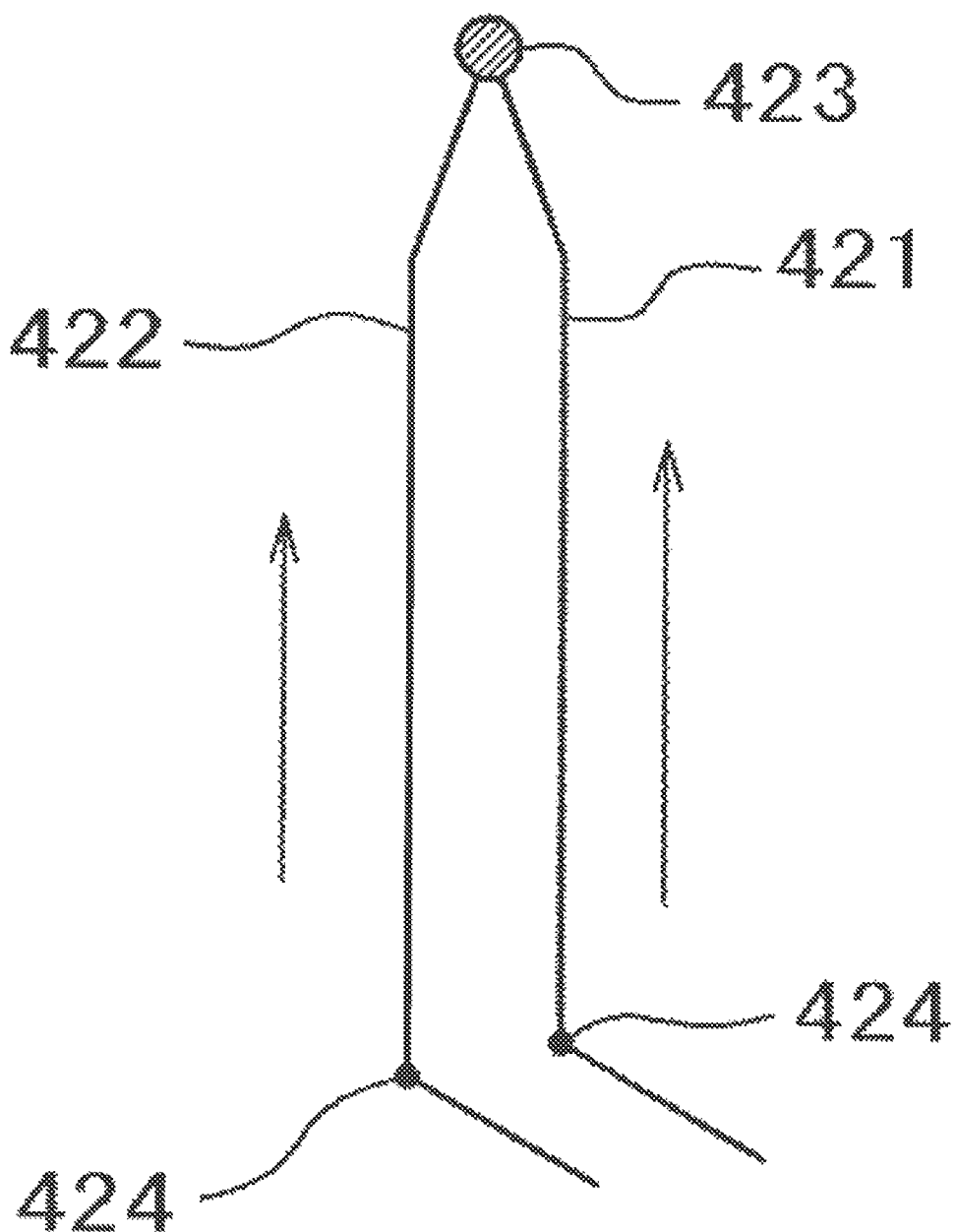
FIG. 15 is a diagram illustrating a support state of the thermocouple of the related art.
Figure 16:
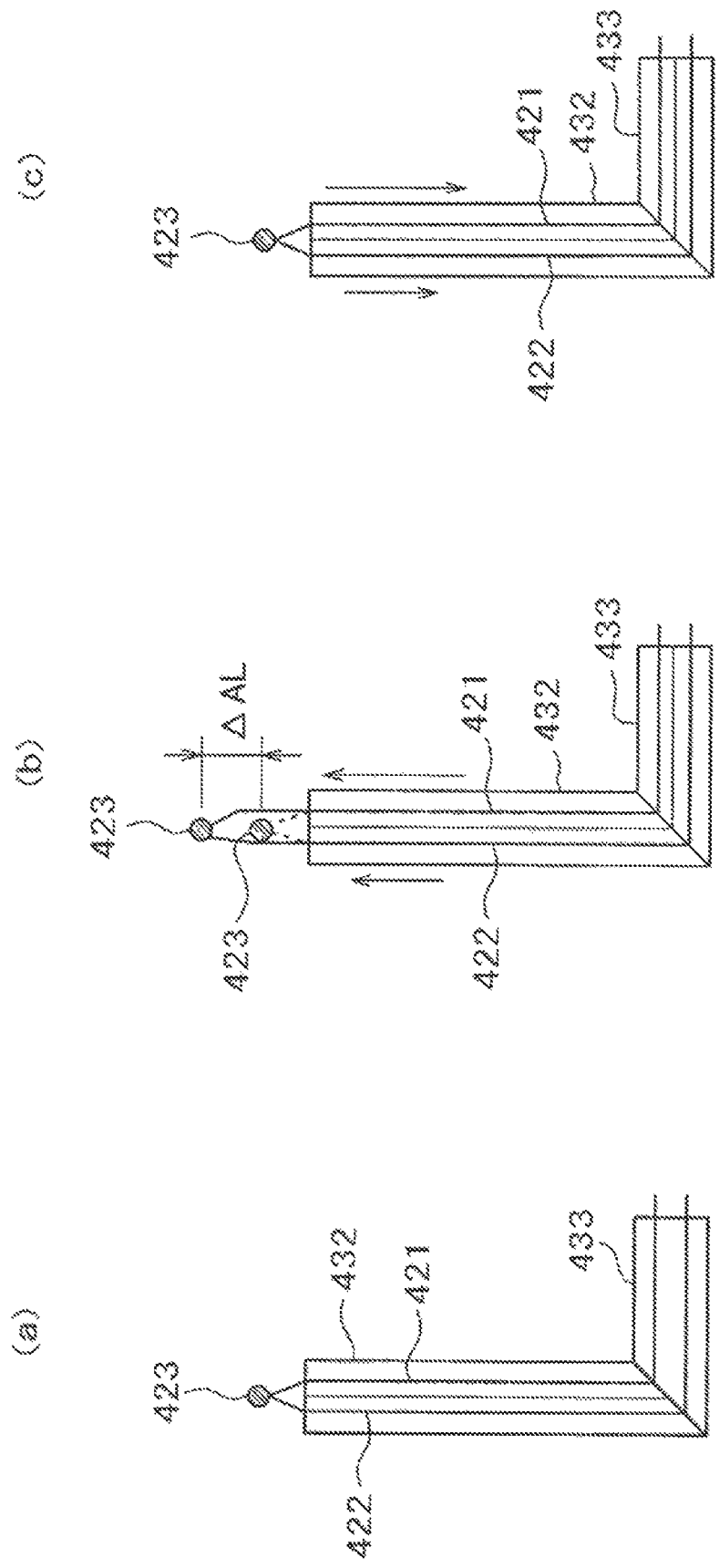
FIG. 16 is a diagram illustrating an expansion and contraction state of the thermocouple of the related art.
Figure 17:
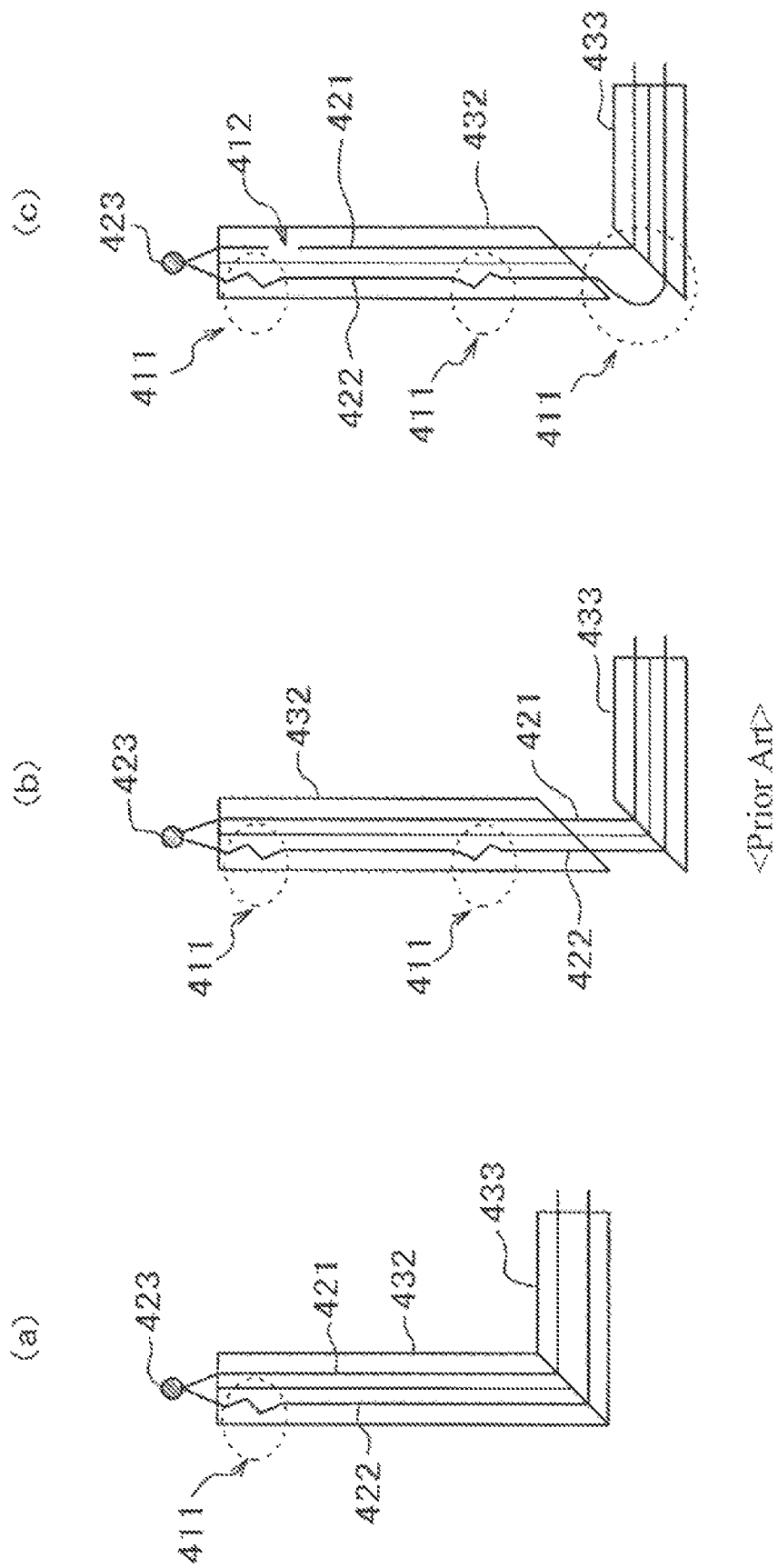
FIG. 17 is a diagram illustrating a state in which the thermocouple of the related art is broken.

Similar to the insulation rod of the related art shown in FIG. 13, the cross section of the insulation rod 32a is elliptical, two holes penetrate the cross section, and the thermocouple wires 21a and 22a for the first thermocouple are inserted and accommodated in two holes. In addition, the insulation rod 32b also has the same shape as the insulation rod 32a, and the thermocouple wires 21b and 22b for the second thermocouple are inserted and accommodated in the two holes. In addition, the insulation rod 32c also has the same shape as the insulation rod 32a, and the thermocouple wires 21c and 22c for the third thermocouple are inserted and accommodated in the two holes. In addition, as shown in FIG. 7a, the third thermocouple is located at the front (a central side of the processing chamber 204) in the insulation rod 32b, and the second thermocouple is located at the rear.

FIG. 7b is a side view of the protection tube 31 or the protection tube holder 36 and a side view of the first thermocouple. FIG. 7c is a vertical cross-sectional enlarged view of a middle portion (a position of the thermocouple wire fixing position 44 of FIG. 7b) of the upper and lower ends of the insulation rod 32a. FIG. 7d is a vertical cross-sectional enlarged view near the thermocouple junction portion 23c of the third thermocouple located at an upper end of the insulation rod 32c. As shown in FIG. 7c, in the thermocouple wires 21a and 22a, an inside of the insulation rod 32a extends in the vertical direction, and the thermocouple junction portion 23a is installed on their upper end. A middle portion between the upper and lower ends of the insulation rod 32a is provided with a fixing portion 41 that fixes the thermocouple wire 21a to the insulation rod 32a and supports the thermocouple wire 21a, and a fixing portion 42 that fixes the thermocouple wire 22a to the insulation rod 32a and supports the thermocouple wire 22a.

In the fixing portion 41, after a part of the insulation rod 32a is removed from the right side of the drawing and only a thermocouple wire 21a of a positive line is exposed, a fixing agent such as cement is injected into the removed portion and fixed. By injecting and embedding the fixing agent without a gap, the thermocouple wire 21a exposed by removing is bonded and fixed to the insulation rod 32a, or the thermocouple wire 21a is deliberately fixed to the fixing portion 41 and is supported at the fixing portion due to an increase in friction caused by being narrowed by the through-hole passing the thermocouple wire 21a. In addition, as shown in FIG. 7c, by slightly bending the thermocouple wire 21a that is exposed once and fixed in a bent state, the thermocouple wire 21a can be strongly fixed.

The fixing portion 42 is a portion in which the same process is performed on the thermocouple wire 22a of a negative line. The size of the fixing portions 41 and 42 in the up and down direction is set to range, for example, from 20 mm to 30 mm and the removed depth is set to a substantially central portion of the insulation rod 32a, and thus an objective of supporting the thermocouple wires 21 and 22 can be sufficiently achieved. The fixing portion 41 and the fixing portion 42 are set to have a distance, for example, about 50 mm, in the vertical direction, but this is in consideration of the insulation rod 32a not being bent when a removal process is performed.

In FIG. 7a, the position of the fixing portion 41 or the fixing portion 42 is slightly moved from a middle portion of the insulation rod 32a to the thermocouple junction portion 23a side of a front end portion. This is to suppress a risk occurring in the related art. That is, since the thermocouple wire below a supporting position is set to the same direction as a heat expansion direction and a self-weight direction, but the thermocouple wire above the supporting position is set to the reverse direction, a risk of problems arising as in the related art is also presented.

In addition, as shown in FIG. 7d, in the thermocouple wires 21c and 22c, an inside of the insulation rod 32c extends in the vertical direction, and the thermocouple junction portion 23c is installed on an upper end thereof. A fixing portion 43 that fixes and supports the thermocouple wires 21c and 22c at the insulation rod 32c is provided at the upper end of the insulation rod 32c.

In the fixing portion 43, after a slit-shaped portion removed in an inner direction toward the drawing is provided for the front end of the insulation rod 32c, a fixing agent such as cement is injected and fixed. By injecting and embedding the fixing agent with no gap, the thermocouple wires 21c and 22c exposed by the removal are bonded and fixed to the insulation rod 32c, or the thermocouple wires 21c and 21c are deliberately fixed to the fixing portion 41 and supported at the fixing portion due to increase in friction caused by narrowing of the through-hole through which the thermocouple wires 21c and 22c pass. As shown in FIG. 7d, by slightly bending the thermocouple wires 21c and 22c exposed and fixed in a bent state, the thermocouple wire 21a can be strongly fixed. A size and depth of the fixing portion 43 in the up and down direction is set to range, for example, from 20 mm to 30 mm, and thus an objective of supporting the thermocouple wires 21c and 22c can be sufficiently accomplished.

As shown in FIG. 7b, other ends of the thermocouple wires 21a and 22a are output from a lower end of the insulation rod 32a in a vertical direction and inserted into the wire holding portion 35 in the horizontal direction to be connected to a temperature control portion (not shown) other than the processing chamber 204, in the protection tube holder 36 of a hollow structure. In addition, FIG. 4b illustrates only the thermocouple wire 21a. However, the thermocouple wires 22a, 21b, 22b, 21c and 22c are the same as the thermocouple wire 21a.

After the thermocouple wire 21a is output below from the lower end of the insulation rod 32a in the vertical direction, the thermocouple wire 21a is changed in the horizontal direction, and is input from one end 35a of the wire holding portion 35 to the wire holding portion 35. A distance from the one end 35a to the bottom portion of the protection tube holder 36 ranges from about 10 mm to 15 mm. In addition, a buffer area 38 in which the thermocouple wire 21d is not bound to the protection tube holder 36 is formed in the protection tube holder 36 upon heat expansion. Similar to the first embodiment, the insulation rod stopper 33 supports the bottom portion of the insulation rod 32 at a position higher than the buffer area 38, and thus the inside thereof is penetrated in the vertical direction, and the thermocouple wire 21a from the lower end of the insulation rod 32a is guided to the buffer area 38 through the through-hole.

Thus, a position 35a of the wire holding portion 35 input by the thermocouple wire 21a and a position of the lower end of the insulation rod 32 are set to be equal to or greater than about 10 mm from the bottom portion of the protection tube holder 36. Thus, the thermocouple wire 21d is in contact with the bottom portion of the protection tube holder 36 upon heat expansion, and binding depending on a force leading to disconnection can be suppressed. In FIG. 7b, within buffer area 38, the thermocouple wire 21a is indicated by a solid line in a standby state (500° C.) before and after the heat treatment, and the thermocouple wire 21a is indicated by dashed line in a process state (1,200° C.) during the heat treatment. In addition, the thermocouple wire 21a is fixed in the wire holding portion 35, similar to the first embodiment.

FIG. 8 is a diagram illustrating an expansion and contraction state of a first thermocouple in the second embodiment of the present invention, FIG. 18a represents a standby state (500° C.) before and after heat treatment, and FIG. 18b represents a process state (1200° C.) during heat treatment. When the standby state of FIG. 5a comes to the heat treatment state of FIG. 8b, the thermocouple wires 21a and 22a and the insulation rod 32a are heat-expanded, and the thermocouple wires protrude from the upper end of the insulation rod 32a, such that the thermocouple wires 21a and 22a are lengthened by ΔL. When the heat treatment state of FIG. 8b comes to the standby state of FIG. 8a, the thermocouple wires 21a and 22a are heat-contracted, such that the thermocouple wires 421 and 422 are shortened by ΔL to thus return to an original length.

In the second embodiment, in order to support the thermocouple wires 21a and 22a at a middle portion of the insulation rod 32a, up to the thermocouple junction portion 23a upward from the supporting position 25, an amount ΔL of protrusion of the thermocouple wires 21a and 22a from the upper end portion of the insulation rod 32a is generated upon heat expansion. Since the amount is so small compared to the configuration of related art, a probability of entanglement due to the heat expansion and heat contraction to be repeated is reduced. In addition, up to the thermocouple junction portion 23a downward from the supporting position 25, an effect of autonomously enhancing linearity can be obtained by a self-weight of the thermocouple wires 21a and 22a, and an increase in a frictional force with an insulation rod 32a can be suppressed.

As described above, the thermocouple junction portion 23a is supported at the upper end or the middle portion of the insulation rod 32a, the insulation rod 32a is supported by the insulation rod stopper 33a, and the insulation rod stopper 33a is supported by the protection tube holder 36. That is, the middle portion of the thermocouple wires 21a and 22a is supported by the insulation rod 32a or the like. In addition, in the thermocouple wires 21a and 22a, a portion output from the lower end of the insulation rod 32a is in a state in which it is not bound to the bottom portion or the like of the protection tube holder 36 in the buffer area 38. Therefore, upon heat expansion, in the lower portion of the support portion of the thermocouple wires 21a, and 22a, the thermocouple wires 21a and 22a maintain the linear shape by a self-weight and thus, partial bending can be suppressed. At the upper portion of the supporting portion of the thermocouple wires 21a and 22a, the amount ΔL of protrusion of the thermocouple wires 21a and 22a from the upper end portion of the insulation rod 32a is reduced, compared to the related art. As a result, a large frictional force generated between the thermocouple wires 21a and 22a and the insulation rod 32a can be suppressed and disconnection of the thermocouple wires 21a and 22a can be suppressed. In addition, a linear expansion coefficient of the insulation rod 32a is adopted to be smaller than those of the thermocouple wires 21a and 22a and thus a change in the position, that is, a change in a temperature measurement position, of the thermocouple junction portion 23a due to heat expansion can be reduced to be smaller than that of the related art.

According to the second embodiment, in addition to the effects (1) to (7) of the first embodiment, at least one of the following effects (8) to (11) can be obtained. (8) The thermocouple wire is fixed and supported at a middle portion in the vertical direction thereof, and a buffer area is provided below the thermocouple wire. In addition, in a state in which the lower portion of the thermocouple wire is not bound to other members, for example, the bottom portion or the like of the protection tube holder, the thermocouple wire of the lower portion of the middle portion can maintain a linear shape by a self-weight and thus, partial bending can be suppressed and disconnection of the thermocouple wire can be suppressed. In addition, bending of the thermocouple wire of the lower portion of the middle portion by the self-weight can be suppressed more than in the related art. (9) When the thermocouple wire is fixed to the upper portion or the middle portion of the insulation rod, since a part of the insulation rod is removed, and an adhesive such as cement is injected into the removed part, the thermocouple wire can be easily fixed to the insulation rod. (10) When the thermocouple wire is fixed to the cut portion of the insulation rod, since the thermocouple wire is configured to be fixed by bending the thermocouple wire exposed to the cut portion and injecting the adhesive in a bent state, the thermocouple wire may be securely fixed to the insulation rod. (11) Since a position fixing the thermocouple wire at the insulation rod is set to a position moved from the middle portion of the insulation rod to the front end side, bending of the thermocouple wire upward from the fixing position can be suppressed more.

Third Embodiment

Figure 9:
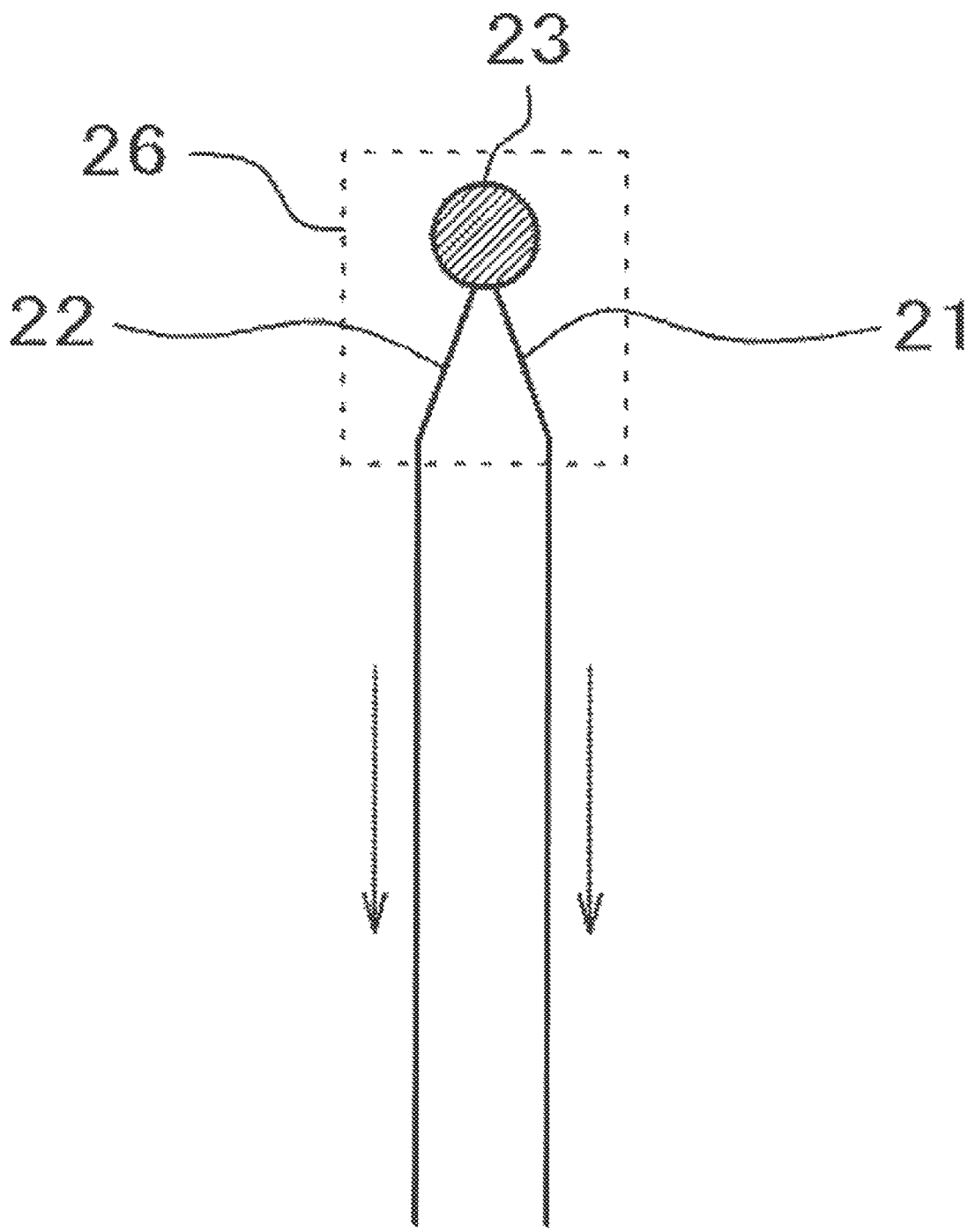
FIG. 9 is a diagram illustrating a support state of a thermocouple in a third embodiment of the present invention.

A configuration of a temperature detecting apparatus of a third embodiment will be described with reference to FIGS. 9 to 11. In this embodiment, as shown in FIG. 9, a thermocouple wire supporting portion 26 of a thermocouple to extend in a vertical direction (up and down direction) is provided at an upper end of the thermocouple wires 21 and 22 and at the supporting position, and the upper end of the thermocouple wires 21 and 22 and the thermocouple junction portion 23 is fixed and supported at an insulation rod by an adhesive such as cement. By this configuration, upon heat expansion, an effect of autonomously enhancing linearity at a portion lower than a supporting position 25 can be obtained by a self-weight of the thermocouple wires 21 and 22, an increase in a frictional force with an insulation rod can be suppressed, and generation of entangled wire deformation due to a change over time can be suppressed. These configurations will be described in detail below.

A difference between the third embodiment and the first embodiment in the substrate processing apparatus is only a method of supporting the thermocouple wire. That is, in the first embodiment, the upper end of the thermocouple wire is supported at an upper end of a wall between through-holes of the insulation rod. However, in the third embodiment, the upper end of the thermocouple wire is fixed and supported at the insulation rod by an adhesive. Since a configuration or substrate processing operation other than the temperature detecting apparatus is the same as in the first embodiment, an explanation will be omitted.

Figure 10:
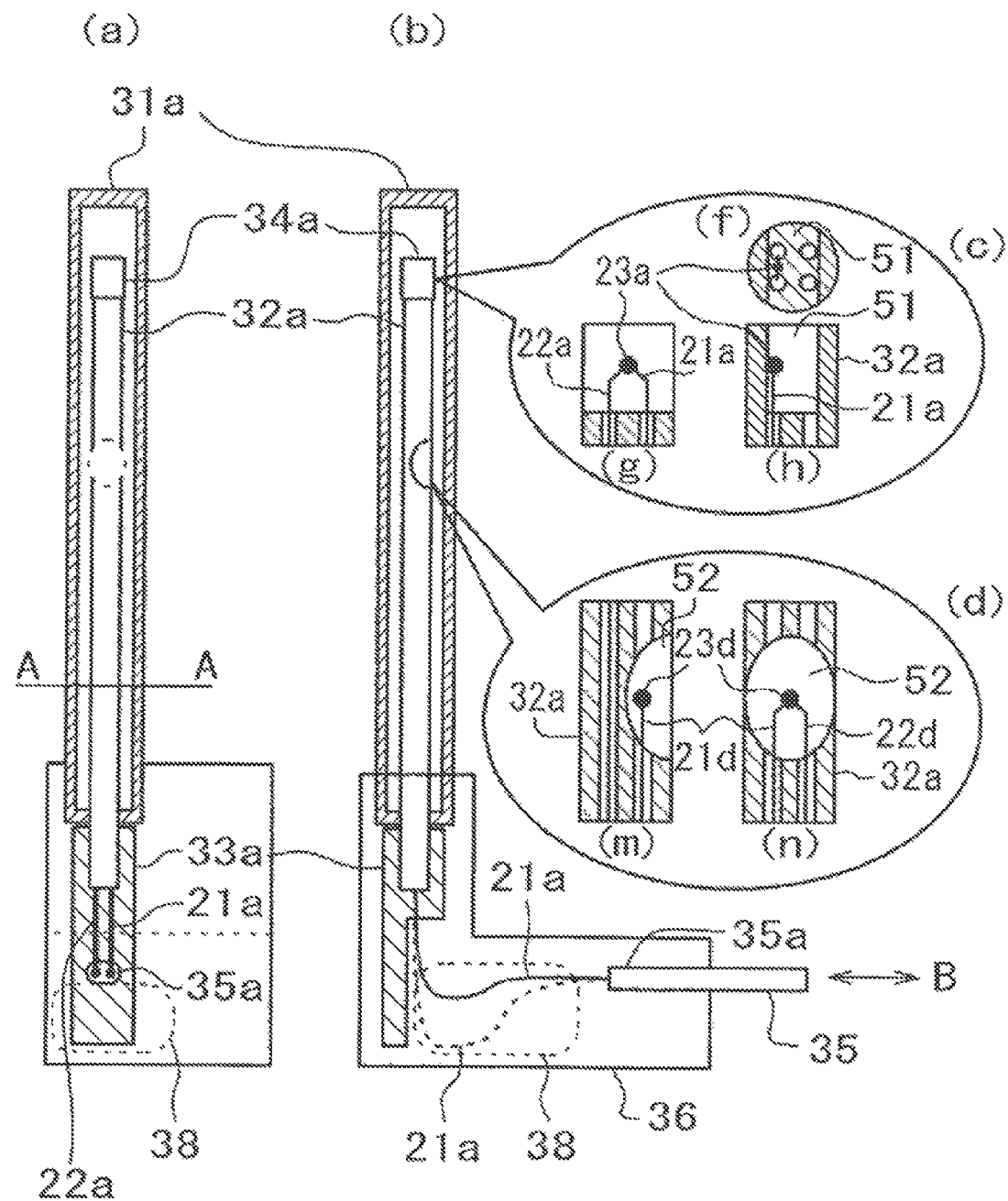
FIG. 10 is a diagram illustrating a structure of the thermocouple in the third embodiment of the present invention.

FIG. 10 is a diagram illustrating a structure of a temperature detecting apparatus in a third embodiment of the present invention. FIG. 10a is a diagram in which a thermocouple between a reaction tube and a soaking tube is viewed from a center of a processing furnace.

FIG. 10b is a vertical cross-sectional view of the temperature detecting apparatus of FIG. 10a from a side thereof. FIG. 11 is a horizontal sectional view along line A-A of FIG. 10a. In addition, in the third embodiment, similar to the first embodiment, there are three protection tubes of the thermocouple, that is, a protection tube 31a, a protection tube 31b, and a protection tube 31c. Although there are first to fifth thermocouples, for a clear and concise explanation, only the protection tube 31a is shown, and matters regarding the protection tube 31a are described.

Figure 11:
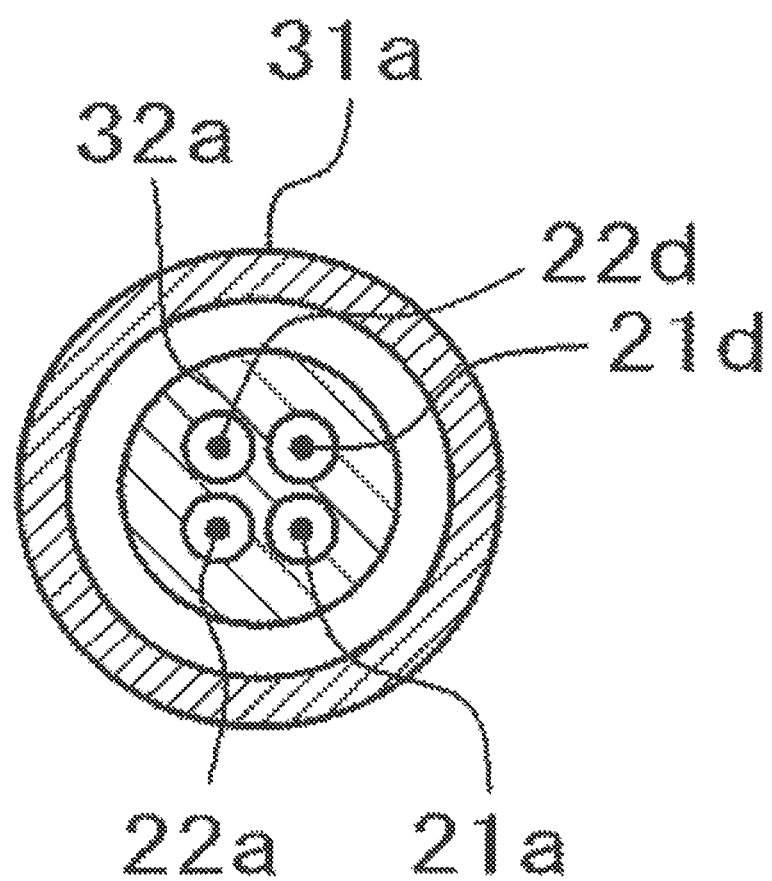
FIG. 11 is a horizontal sectional view of the thermocouple of FIG. 10.
Figure 12:
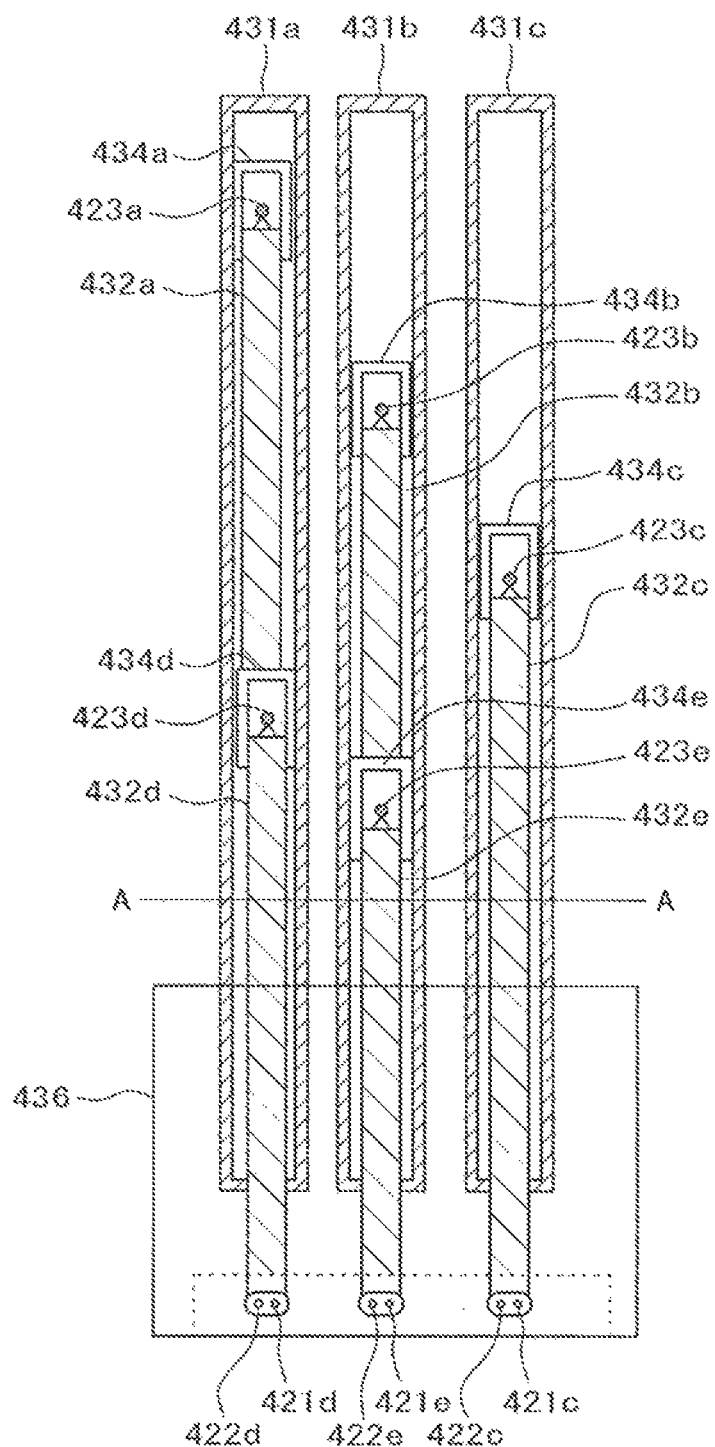
FIG. 12 is a diagram illustrating a structure of a thermocouple of the related art.

A thermocouple wire 21 of a plus side and a thermocouple wire 22 of a minus side are accommodated, and an insulation rod 32a for insulating the thermocouple wires 21 and 22 from each other is inserted in each protection tube 31a (see FIG. 11). As shown in FIGS. 10a and 10b, the lower end of the protection tube 31a is supported by the protection tube holder 36. The lower end of the insulation rod 32a is inserted and supported in the insulation rod stopper 33a. The lower end of the insulation rod stopper 33a is supported by a bottom portion of the protection tube holder 36.

In the third embodiment, similar to the first embodiment, the first thermocouple to the fifth thermocouple are also disposed at five heater zones of the processing furnace. Similar to the first embodiment, the first thermocouple and the third thermocouple are disposed in the protection tube 31a. The first temperature detecting apparatus including the first thermocouple is configured to include a thermocouple wire 21a of a plus side and a thermocouple wire 22a of a minus side, a thermocouple junction portion 23a in which the thermocouple wires 21a and 22a are jointed at a front end portion thereof, an insulation rod 32a for insulating the thermocouple wires 21a and 22a from each other, a cap 34a for closing an upper end of the insulation rod 32a, the insulation rod stopper 33a, the protection tube 31a, and a protection tube holder 36. The third temperature detecting apparatus including the third thermocouple is configured to include a thermocouple wire 21d of the plus side and a thermocouple wire 22d of the minus side, a thermocouple junction portion 23d in which the thermocouple wires 21d and 22d are jointed at a front end portion thereof, the insulation rod 32a for insulating the thermocouple wires 21d and 22d from each other, the cap 34a for closing the upper end of the insulation rod 32a, the insulation rod stopper 33a, the protection tube 31a, and the protection tube holder 36.

Referring to FIG. 10a, the thermocouple junction portion 23a for the first thermocouple is disposed at a position of the cap 34a of the front end of the insulation rod 32a, and the thermocouple junction portion 23d for the third thermocouple is disposed at a middle portion of the insulation rod 32a. As shown in FIG. 1, which is a cross sectional view taken along line A-A of FIG. 10a, similar to the insulation rod in the first embodiment, the cross section of the insulation rod 32a is circular, four holes penetrate the cross section, and the thermocouple wires 21a and 22a for the first thermocouple and the thermocouple wires 21d and 22d for the third thermocouple are inserted and accommodated in the four holes. The first thermocouple is located at the front (a central side of the processing chamber 204) in the insulation rod 32a, and the third thermocouple is located at the rear.

FIG. 10b is a side view of the protection tube 31a or protection tube holder 36 and a side view of the first thermocouple and the third thermocouple. FIG. 10e is a vertical cross-sectional enlarged view near the thermocouple junction portion 23a of the first thermocouple located at the upper end of the insulation rod 32a. FIG. 10c includes FIG. 10h viewed from the front of the drawing by enlarging a corresponding part, FIG. 10f viewed from the top of a portion of FIG. 10h, and FIG. 10g viewed from the left of a portion of FIG. 10h.

As shown in FIG. 10c, a slit shape removal portion 51 is provided in an inner direction toward the drawing. The thermocouple junction portion 23a is installed on the thermocouple wire 21a in which the inside of insulation rod 32a extends in the vertical direction, and the upper end of the thermocouple wire 22a, and disposed on the removal portion 51. A fixing agent such as cement is injected into the removal portion 51. The thermocouple wire 21a, the thermocouple wire 22a and the thermocouple junction portion 23a are fixed and supported at the removal portion 51 of the insulation rod 32a. By injecting and embedding the fixing agent without a gap, the thermocouple wires 21a and 22a exposed by removing are bonded and fixed to the insulation rod 32a, or the thermocouple wires 21a and 22a are deliberately fixed to the fixing portion 41 and supported at the fixing portion due to increase in friction caused by narrowing of the through-hole through which the thermocouple wires 21a and 22a pass.

FIG. 10d is a vertical cross-sectional enlarged view near the thermocouple junction portion 23d of the third thermocouple located at a middle portion of the upper and lower ends of the insulation rod 32a. FIG. 10d includes FIG. 10m viewed from the front of the drawing by enlarging a corresponding part, and FIG. 10n viewed from the right of a portion of FIG. 10m. As shown in FIG. 10d, the thermocouple junction portion 23d is installed on the thermocouple wire 21d in which the inside of the insulation rod 32a extends in the vertical direction, and the upper end of thermocouple wire 22d. The insulation rod 32a of a portion provided with the thermocouple junction portion 23d is removed, while leaving a partial portion of the outer periphery of the insulation rod 32a. The thermocouple wire 21d, the thermocouple wire 22d and the thermocouple junction portion 23d are fixed and supported at the removal portion 52 by an adhesive such as cement.

The size of the removal portions 51 and 52 in the up and down direction is set to range, for example, from 20 mm to 30 mm and the removed depth of the removal portion 52 is set to a substantially central portion of the insulation rod 32a, and thus an objective of supporting the thermocouple wires 21 and 22 can be sufficiently accomplished.

As shown in FIG. 10b, other ends of the thermocouple wires 21a and 22a are output from the lower end of the insulation rod 32a in the vertical direction and inserted into the wire holding portion 35 in the horizontal direction to be connected to a temperature control portion (not shown) other than the processing chamber 204, in the protection tube holder 36 of a hollow structure.

After the thermocouple wire 21a is output below from the lower end of the insulation rod 32a in the vertical direction, the thermocouple wire 21a is changed in the horizontal direction, and is input from one end 35a of the wire holding portion 35 to the wire holding portion 35. A distance from the one end 35a to the bottom portion of the protection tube holder 36 ranges, for example, from 10 mm to 15 mm, similar to the first embodiment. In addition, a buffer area 38 in which the thermocouple wire 21a is not bound to the protection tube holder 36 upon heat expansion is formed in the protection tube holder 36. Similar to the first embodiment, the insulation rod stopper 33 supports the bottom portion of the insulation rod 32 at a position higher than the buffer area 38 and thus, the inside of thereof is penetrated in the vertical direction, and the thermocouple wire 21a from the lower end of the insulation rod 32a is guided to the buffer area 38 through the through-hole.

Accordingly, a position of the wire holding portion 35 input by the thermocouple wire 21a and a position of the lower end of the insulation rod 32 are set to higher than the buffer area 38. Thus, the thermocouple wire 21a is in contact with the bottom portion of the protection tube holder 36 upon heat expansion, and binding from a force leading to disconnection can be suppressed. In FIG. 10b, within the buffer area 38, the thermocouple wire 21a is indicated by a solid line in a standby state (500° C.) before and after the heat treatment, and the thermocouple wire 21a is indicated by a dashed line in a process state (1,200° C.) during the heat treatment. In addition, the thermocouple wire 21a is fixed in the wire holding portion 35, similar to the first embodiment.

In the third embodiment, since the thermocouple wire 23 or the upper end of the thermocouple wires 21 and 22 is fixed and supported at the insulation rod 32, up to the buffer area downward from the thermocouple wire supporting portion 26, an effect of autonomously enhancing linearity can be obtained by a self-weight of the thermocouple wires 21 and 22, and an increase in a frictional force with an insulation rod 32a can be suppressed.

As described above, the thermocouple junction portion 23 is supported at the upper end or the middle portion of the insulation rod 32, the insulation rod 32 is supported by the insulation rod stopper 33a and the insulation rod stopper 33 is supported by the protection tube holder 36. That is, the upper ends of the thermocouple wires 21a and 22a are fixed and supported by the insulation rod 32. In addition, in the thermocouple wires 21 and 22, a portion output from the lower end of the insulation rod 32 is in state in which it is not bound to the bottom portion or the like of the protection tube holder 36 in the buffer area 38. Therefore, the same effect as the first embodiment can be obtained, and disconnection of the thermocouple wires 21 and 22 can be suppressed.

According to the third embodiment, in addition to the effects (1) to (7) of the first embodiment, at least the following effect (12) can be obtained. (12) When the thermocouple wire is fixed to the upper portion or the middle portion of the insulation rod, since a part of the insulation rod is removed, and an adhesive such as cement is injected into the removed part, the thermocouple wire can be easily fixed to the insulation rod.

Fourth Embodiment

Figure 18:
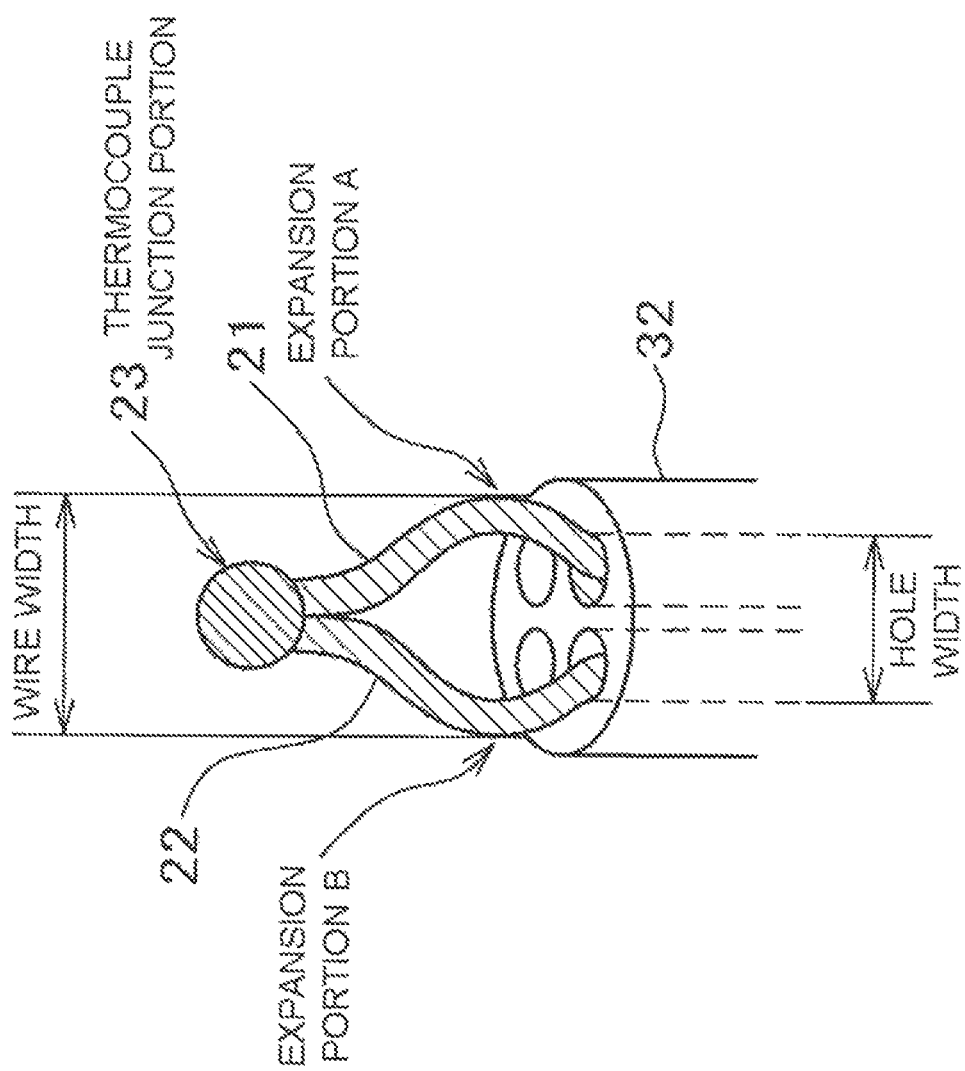
FIG. 18 is a diagram illustrating a support state of a thermocouple in a fourth embodiment of the present invention.

A configuration of a temperature detecting apparatus of a fourth embodiment will be described with reference to FIGS. 18 to 21. FIG. 18 is a diagram illustrating a support state of a thermocouple in a fourth embodiment of the present invention. A difference between the fourth embodiment and the third embodiment in the substrate processing apparatus is only a structure supporting the thermocouple wire and other configurations are the same as in the third embodiment. In the fourth embodiment, as shown in FIG. 18, substantially immediately below the thermocouple junction portion 23, the thermocouple wire 21 and the thermocouple wire are bent to expand to the outside and then an expanded portion A and an expanded portion B, which expand outward in a horizontal direction, are formed in the thermocouple wire 21 and the thermocouple wire 22, respectively. A wire width formed by the expanded portion A and the expanded portion B is configured to be larger than a hole width formed by two through-holes in which the thermocouple wire 21 and the thermocouple wire 22 are inserted. Here, the wire width may be a maximum distance in which outer peripheries of the expanded portion A and the expanded portion B of the two thermocouple wires, which are connected at the thermocouple junction portion 23, are formed above the upper end of the insulation rod 32, that is, the longest straight line of straight lines in which outer peripheries of the two thermocouple wires between an upper end surface of the insulation rod 30 and the thermocouple junction portion 23, are connected in a horizontal direction. The hole width may be an elliptical length diameter including two through-holes in which the thermocouple wire 21 and the thermocouple wire 22 are inserted, and a distance of the longest straight line of straight lines in which outer peripheries (the circumference in the example of FIG. 18) of the two through-holes are connected, more specifically, a distance of the longest straight line of straight lines in which the circumferences of two circles that form a horizontal section of two through-holes at the upper end of the insulation rod 32 are connected in a horizontal direction.

Thus, since the wire width in the vicinity of thermocouple junction portion 23 is larger than that the hole width, the outer peripheries of the thermocouple wire 21 and the thermocouple wire 22 are entangled in parts of the circumferences of two through-holes at the upper end of the insulation rod 32, that is, are supported by the upper end surface of the insulation rod 32. For example, in the first embodiment described above, since the wire width is not configured to be larger than the hole width, in a state in which the thermocouple junction portion 23 is supported by the insulation rod 32, a force is generated to the thermocouple junction portion 23 in the outside direction, due to the gravity of the thermocouple wire 21 and the thermocouple wire 22. For this reason, there is a need to increase the strength of the thermocouple junction portion 23, for example, the size of the thermocouple junction portion 23, such that the thermocouple junction portion 23 to which the thermocouple wire 21 and the thermocouple wire 22 are connected is not damaged. In contrast, in the fourth embodiment, since the wire width is configured to be larger than the hole width, in a state in which the thermocouple wire 21 and the thermocouple wire 22 are supported by the upper end surface of the insulation rod 32, the gravity of the thermocouple wire 21 and the thermocouple wire 22 is supported at the upper end surface of the insulation rod 32 and thus a force applied to the thermocouple junction portion 23 can be reduced more than that of the first embodiment. In addition, when the substrate processing apparatus is manufactured and the thermocouple is assembled, even if the thermocouple wire is pulled below by mistake, the damage of the thermocouple junction portion can be suppressed. In addition, even if a force is applied to a lower side of the thermocouple wire due to vibration caused by transportation of the substrate processing apparatus, the damage of the thermocouple junction portion can be suppressed.

Figure 19:
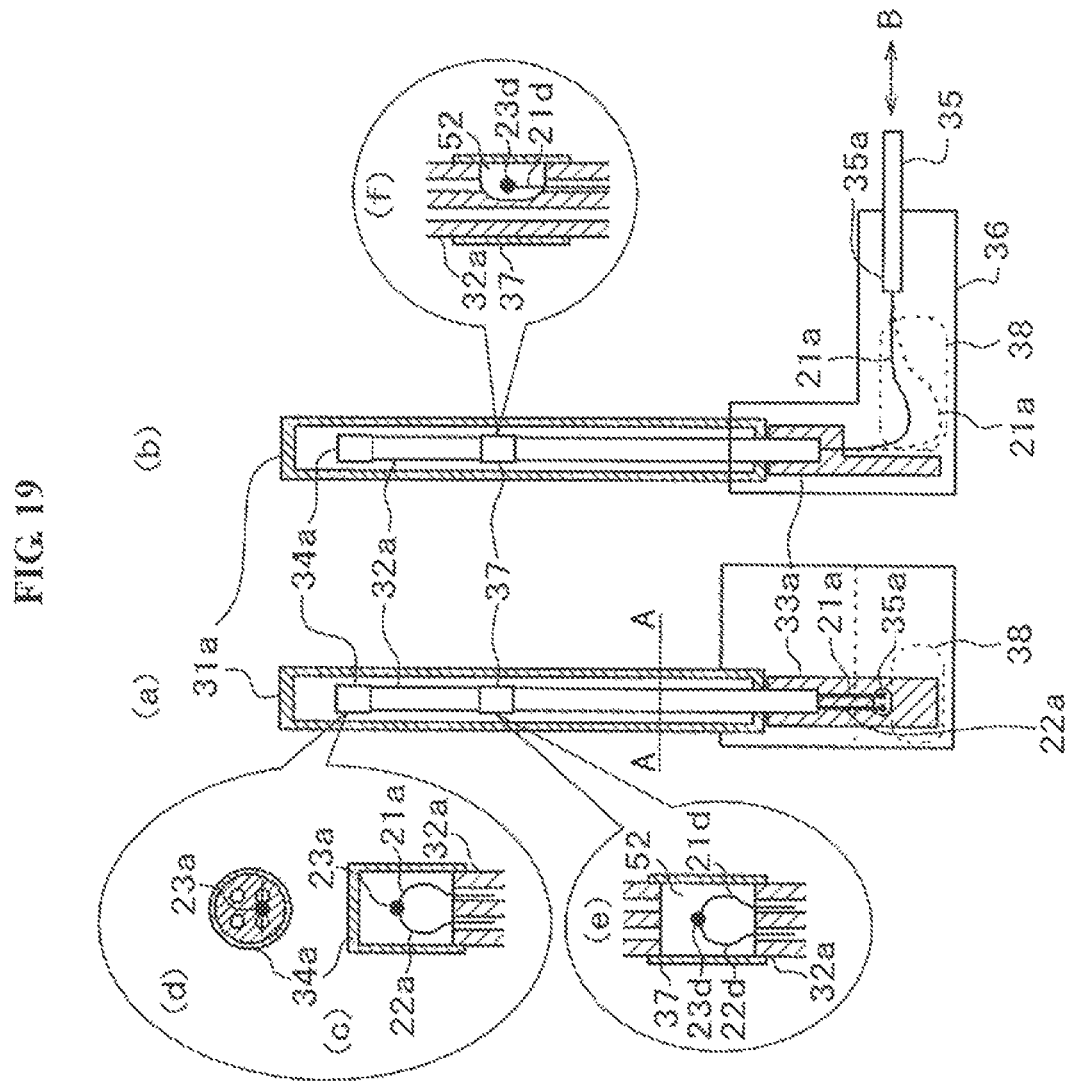
FIG. 19 is a diagram illustrating an example of a structure of the thermocouple in the fourth embodiment of the present invention.
Figure 20:
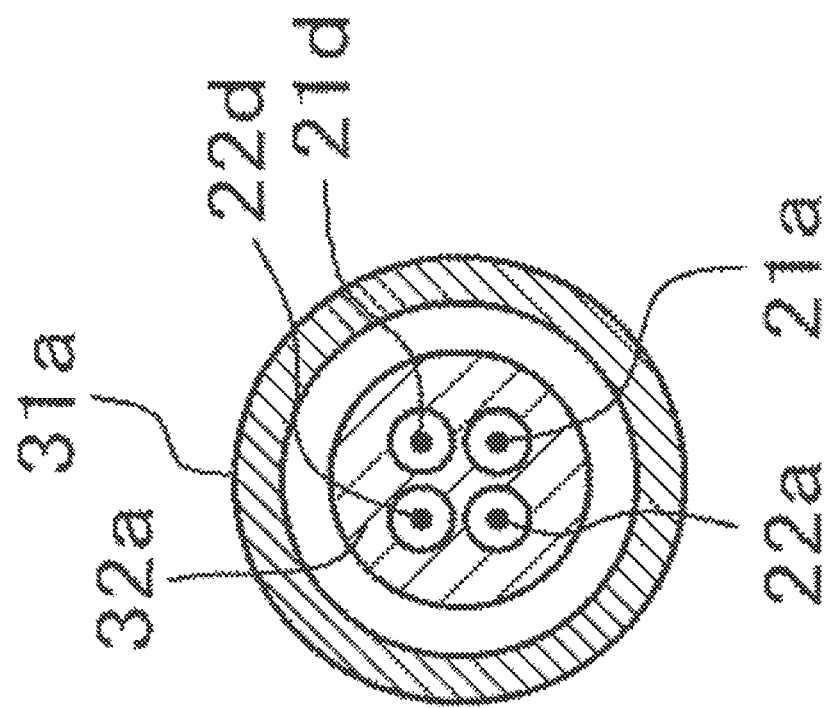
FIG. 20 is a horizontal sectional view of the thermocouple of FIG. 19.

As described above, a difference between the substrate processing apparatus of the fourth embodiment and that of the third embodiment is only a structure of supporting the thermocouple wire. Thus, since the configuration or substrate processing operation other than the temperature detecting apparatus is the same as in the third embodiment, an explanation will be omitted. FIG. 19 is a diagram illustrating an example of a structure of a temperature detecting apparatus in the fourth embodiment of the present invention. FIG. 19a is a diagram in which a thermocouple between a reaction tube and a soaking tube is viewed from a central of the processing furnace. FIG. 19b is a vertical cross-sectional view that views the temperature detecting apparatus of FIG. 19a from a side thereof. FIG. 20 is a horizontal sectional view of A-A section of FIG. 19a. In addition, in the fourth embodiment, similar to the third embodiment, there are three protection tubes of the thermocouple, that is, a protection tube 31a, a protection tube 31b, and a protection tube 31c. Although there are first to fifth thermocouples, to make the explanation shot and clear, only protection tube 31a is shown in FIG. 19, and matters relating to the protection tube 31a is described.

A thermocouple wire 21 of a plus side and a thermocouple wire 22 of a minus side are accommodated, and an insulation rod 32a for insulating the thermocouple wires 21 and 22 each other is inserted in each protection tube 31a (see FIG. 20). As shown in FIGS. 19a and 19b, a lower end of the protection tube 31a is supported by a protection tube holder 36. A lower end of the insulation rod 32a is inserted and supported in a insulation rod stopper 33a. A lower end of the insulation rod stopper 33a is supported by a bottom portion of the protection tube holder 36.

Also, in the fourth embodiment, similar to the third embodiment, the first thermocouple and the third thermocouple are disposed in the protection tube 31a. The first temperature detecting apparatus including the first thermocouple is configured to include a thermocouple wire 21a of the plus side and a thermocouple wire 22a of the minus side, a thermocouple junction portion 23a in which the thermocouple wires 21a and 22a are jointed at the front end portion thereof, the insulation rod 32a for insulating the thermocouple wires 21a and 22a each other, a cap 34a for closing an upper end of the insulation rod 32a, a cover 37 for covering an outer periphery of the insulation rod 32a in the vicinity of a thermocouple junction portion 23d, the insulation rod stopper 33a, the protection tube 31a, and the protection tube holder 36. The third temperature detecting apparatus including the third thermocouple is configured to include a thermocouple wire 21d of the plus side and a thermocouple wire 22d of the minus side, a thermocouple junction portion 23d in which the thermocouple wires 21d and portion 22d are jointed at a front end portion thereof, the insulation rod 32a for insulating the thermocouple wires 21d and 22d each other, the cap 34a for closing the upper end of the insulation rod 32a, the cover 37 for covering the outer periphery of the insulation rod 32a in the vicinity of the thermocouple junction portion 23d, the insulation rod stopper 33a, the protection tube 31a, and the protection tube holder 36.

Referring to FIG. 19a, the thermocouple junction portion 23a for the first thermocouple is disposed at a position of the cap of the front end 34a of the insulation rod 32a, the thermocouple junction portion 23d for the third thermocouple is disposed at a position of a cover 37 of the middle portion of the insulation rod 32a. As shown in FIG. 20, which is a cross sectional view taken along A-A, similar to the insulation rod in the third embodiment, the insulation rod 32a is circular, four holes penetrate through the cross section, the thermocouple wires 21a and 22a for the first thermocouple and the thermocouple wires 21d and 22d for the third thermocouple are inserted and accommodated in the four holes. The first thermocouple is located at the front (a central side of the processing chamber 204) in the insulation rod 32a, and the third thermocouple is located at the rear.

FIG. 19b is a side view of the protection tube 31a or the protection tube holder 36 and a side view of the first thermocouple and the third thermocouple. FIG. 19c is a vertical cross-sectional enlarged view near the thermocouple junction portion 23a of the first thermocouple located at the upper end of the insulation rod 32a. FIG. 19d is a diagram viewed from the top of a portion of the FIG. 19c. As shown in FIG. 19c, the thermocouple junction portion 23a is installed on the thermocouple wire 21a in which the inside of the insulation rod 32a extends in the vertical direction, and the upper end of thermocouple wire 22a. In addition, two thermocouple wires 21a and 22a between the upper end surface of the insulation rod 32a and the thermocouple junction portion 23a form an expanded portion outward in a horizontal direction. As described in FIG. 18, a wire width formed by the expanded portions is configured to be larger than a hole width formed by two through-holes in which the thermocouple wire 21a and the thermocouple wire 22a are inserted. Thus, the thermocouple wire 21a and the thermocouple wire 22a are supported at the upper end of the insulation rod 32a.

FIG. 19e is a vertical cross-sectional enlarged view near the thermocouple junction portion 23d of the third thermocouple located at a middle of the upper and lower ends of the insulation rod 32a. FIG. 19f is a side view of FIG. 19e. As shown in FIG. 19e, the thermocouple junction portion 23d is installed on the thermocouple wire 21d in which the inside of the insulation rod 32a extends in the vertical direction, and the upper end of thermocouple wire 22d. The insulation rod 32a of a portion provided with the thermocouple junction portion 23d is removed, while leaving a part portion of the outer periphery of the insulation rod 32a. At the removal portion 52, the thermocouple wire 21d and thermocouple wire 22d form an expanded portion outward in a horizontal direction. As described in FIG. 18, a wire width formed by the expanded portions is configured to be larger than a hole width formed by two through-holes in which the thermocouple wire 21d and the thermocouple wire 22d are inserted. Thus, the thermocouple wire 21d and the thermocouple wire 22d are supported at the lower end of the removal portion 52 of the insulation rod 32a.

The size of the removal portion 52 in the up and down direction is set to range, for example, from 10 mm to 30 mm and the removed depth of the removal portion 52 is set to a substantially central portion of the insulation rod 32a, and thus an objective of supporting the thermocouple wires 21d and 22d can be sufficiently achieved. A cylindrical cover 37 for protecting the thermocouple junction portion 23d or the thermocouple wire 21d, or the thermocouple wire 22d is fixed and provided at the outside of the removal portion 52 so as to surround the outer periphery of the insulation rod 32a. A material of the cover 37 is made of; for example, alumina, similar to the cap 34. In addition, as shown in FIG. 19b, other ends of thermocouple wires 21 and 22 are located in the protection tube holder 36 of the in a hollow structure, but configurations and operations in the protection tube holder 36 are the same as these of the third embodiment.

Figure 21:
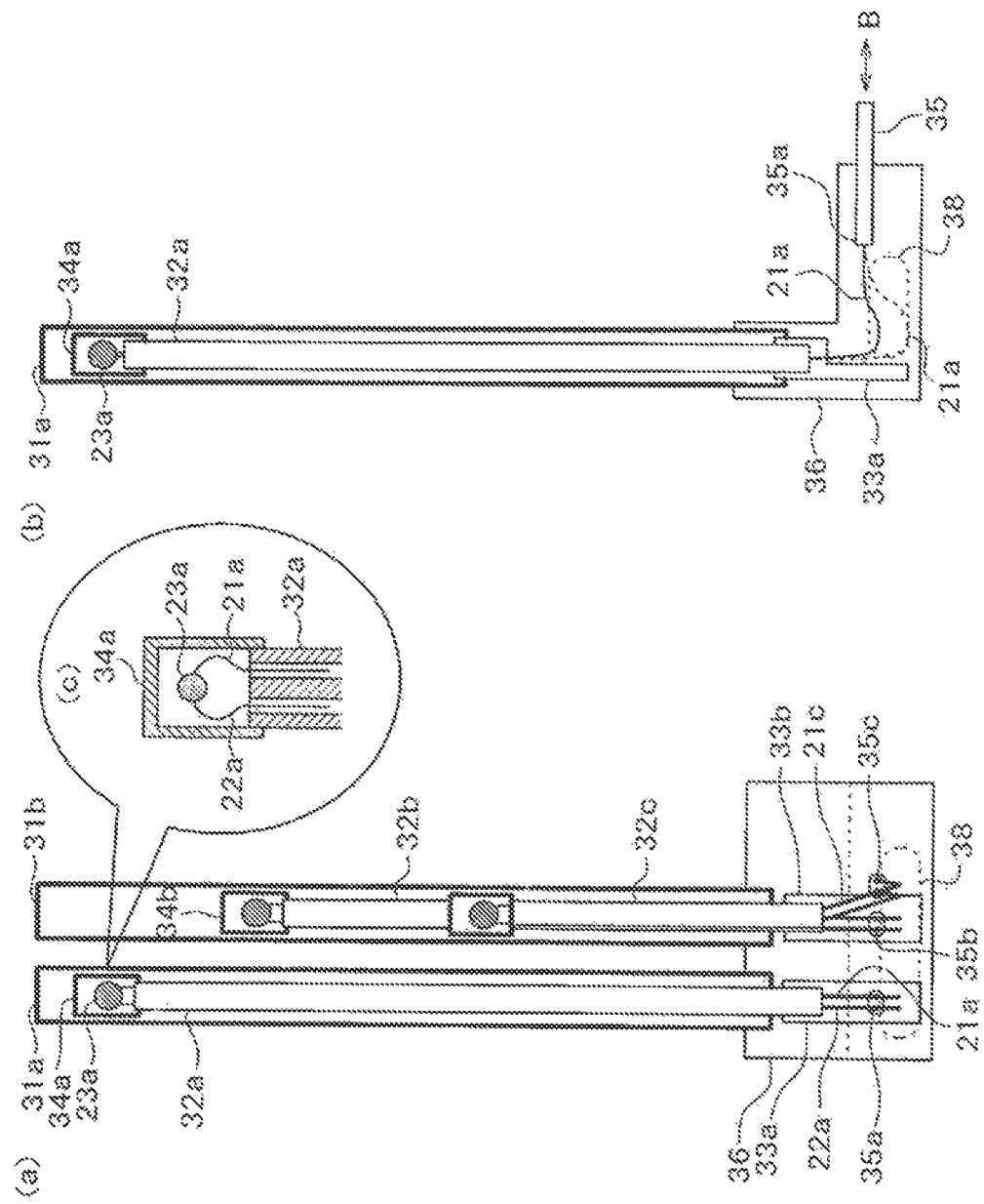
FIG. 21 is a diagram illustrating another example of the structure of the thermocouple in the fourth embodiment of the present invention.

The other configuration example of the temperature detecting apparatus in the fourth embodiment will be described with reference to FIG. 21. FIG. 21 is a diagram illustrating a structure of another configuration example of a thermocouple structure in the fourth embodiment of the present invention. FIG. 21a is a diagram in which a thermocouple between a reaction tube and a soaking tube is viewed from a central of the processing furnace. FIG. 21b is a vertical cross-sectional view that views the temperature detecting apparatus of FIG. 21a from a side thereof. This configuration example changes only the supporting structure of the thermocouple wire in the temperature detecting apparatus (FIG. 7) of the second embodiment, and another configuration is the same as in the second embodiment.

In this configuration example, similar to the second embodiment, as shown in FIG. 21a, there are two protection tubes of the thermocouple, that is, the protection tube 31a and the protection tube 31b. A lower end of each protection tube is supported by a protection tube holder 36. Since structure within the protection tube holder 36 is the same as in the second embodiment, an explanation will be omitted. A thermocouple wire 21 of a plus side and a thermocouple wire 22 of a minus side are accommodated, and an insulation rod 32 for insulating the thermocouple wires 21 and 22 each other is inserted in each protection tube 31. An insulation rod 32a is inserted in the protection tube 31a, and an insulation rod 32b and an insulation rod 32c are inserted in the protection tube 31b.

In this configuration example, similar to the second embodiment, the thermocouple is disposed on three zone heaters of the processing furnace, respectively. The first thermocouple is for temperature detection of the uppermost heater (U zone heater) of the processing furnace, the second thermocouple is for temperature detection of the heater (C zone heater) immediately below the U zone heater, and the third thermocouple is for temperature detection of the heater (L zone heater) immediately below the C zone heater. The configuration of the temperature detecting apparatuses including each thermocouple is similar to that of the second embodiment. For example, the first temperature detecting apparatus including the first thermocouple is configured to include the thermocouple wire 21a of the plus side and the thermocouple wire 22a of the minus side, the thermocouple junction portion 23a in which the thermocouple wires 21a and 22a are jointed at the front end portion thereof, the insulation rod 32a for insulating the thermocouple wires 21a and 22a each other, the cap 34a for closing the upper end of the insulation rod 32a, the insulation rod stopper 33a, the protection tube 31a, and the protection tube holder 36.

As shown in FIG. 21a, the thermocouple junction portion 23a for the first thermocouple is disposed at a position of the front end 34a of the cap of the insulation rod 32a. Similar to the insulation rod of the related art shown in FIG. 13, the cross section of the insulation rod 32a is elliptical, two holes penetrates through the cross section, and the thermocouple wires 21a and 22a for the first thermocouple are inserted and accommodated in the two holes. The insulation rod 32b or the insulation rod 32c also has the same shape as the insulation rod 32a.

FIG. 21c is a vertical cross-sectional enlarged view near the thermocouple junction portion 23a of the first thermocouple located at the upper end of the insulation rod 32a. As shown in FIG. 21c, in the thermocouple wires 21a and 22a, the inside of insulation rod 32a extends in the vertical direction, and the thermocouple junction portion 23a is provided at the upper end thereof. The expanded portion expanding outward in the horizontal direction is provided at the thermocouple wires 21a and 22a between the thermocouple junction portion 23a and the upper end surface of the insulation rod 32a. A wire width formed by the expanded portions is configured to be larger than a hole width formed by two through-holes in which the thermocouple wires 21a and 22a are inserted. Thus, the thermocouple wires 21a and 22a can be supported by the upper end of the insulation rod 32a and a force applied to the thermocouple junction portion 23a can be reduced.

According to the fourth embodiment, in addition to the effects (1) to (7) of the first embodiment, at least the following effect (13) can be obtained. (13) The expanded portion expanding outward in the horizontal direction is provided at the thermocouple wires 21a and 22a between the thermocouple junction portion and the upper end surface of the insulation rod. Since a wire width formed by the expanded portions is configured to be larger than a hole width formed by two through-holes in which the thermocouple wire 21 and the thermocouple wire 22 are inserted, the thermocouple wire can be supported by the upper end of the insulation rod and a force applied to the thermocouple junction portion can be reduced.

In addition, it is obvious that the present invention is not limited to the embodiments described above, and various modifications can be possible without departing from the scope of the present invention. In the first embodiment described above, the upper end of the thermocouple wire is supported at the upper end of the wall between the through-holes of the insulation rod. However, as in the third embodiment, the upper end of the thermocouple wire may be fixed and supported at the insulation rod through an adhesive. In addition, as described above, four through-holes of the insulation rod are used in the first embodiment or the third embodiment, and two through-holes of the insulation rod are used in the second embodiment. However the through-holes of different numbers may be used. For example, one through hole of the insulation rod may be used, and the thermocouple wire of a plus side or the thermocouple wire of a minus side can pass through the one through hole. In this case, two insulation rods for plus and minus will be needed for one thermocouple.

In addition, in the fourth embodiment described above, the expanded portion of the thermocouple wire is formed so as to have a slightly bent shape. However, the present invention is not limited thereto, and for example, the expanded portion may be formed so as to have a right angle bent shape. In addition, in the fourth embodiment described above, the thermocouple wire is provided with the expanded portion, and the thermocouple wire is supported at the upper end of the insulation rod by the expanded portion. However, a supported body longer than a hole width in a horizontal direction formed by two through-holes in which the thermocouple wire 21 and the thermocouple wire 22 are inserted may be provided at the thermocouple wire between the thermocouple junction portion and the upper end surface of the insulation rod. The supported body may be configured by bonding a rod-like object, for example, made of alumina, to the thermocouple wire 21 and the thermocouple wire 22 through an adhesive. In addition, in such a configuration, similar to the configuration in which the expanded portion is formed in the thermocouple wire, a force applied to the thermocouple junction portion can be reduced. In addition, the expanded portion is not formed for the thermocouple wire, and the thermocouple wire can be supported at the upper end surface of the insulation rod by reducing a space between two thermocouple wires to less than a minimum length that connects outer peripheries of the two through-holes. In addition, the thermocouple wire can be supported at the upper end surface of the insulation rod by wringing or twisting the two thermocouple wires. In this case, the two thermocouple wires are isolated from each other so as to not electrically short.

In addition, in the above-described embodiments, a process performed on wafers has been described. However, objects to be processed may be substrates other than the wafers and may also be a hot mask or printed wiring substrate, an LED panel, a compact disk or magnetic disk, etc. In addition, in the embodiments described above, a case in which a vertical batch-type hot wall device using the reaction tube and the soaking tube is applied has been described, but the present invention is not limited to thereof and a substrate processing apparatus in which the soaking tube is not used can be applied. In addition, the present invention can be applied to a glass substrate such as an LCD manufacturing apparatus or another substrate processing apparatus as well as a semiconductor manufacturing apparatus. The substrate processing may be an exposure process, lithography, a coating process, etc., as well as a film forming process such as CVD or a PVD for forming an oxide film, a nitride film, a metal-containing film and the like.

This specification includes at least the following inventions. That is, the first invention relates to a temperature detecting apparatus. The temperature detecting apparatus includes: an insulation rod installed to extend in a vertical direction and including a through-hole in vertical direction; a thermocouple wire inserted in the through-hole of the insulation rod, the thermocouple wire including a thermocouple junction portion at an upper end thereof and an angled portion at a lower end of the insulation rod; and a buffer area installed below the insulation rod and configured to suppress a restriction of a horizontal portion of the angled portion upon heat expansion, wherein an upper portion of the thermocouple wire or a middle portion in the vertical direction are supported by the insulation rod.

As the second invention, the temperature detecting apparatus according to the first invention further includes a wire holding portion configured to fix a portion of the horizontal portion of the angled portion.

As the third invention, the temperature detecting apparatus according to the second invention further includes a protection tube configured to accommodate the insulation rod; and a protection tube holder configured to support a lower portion of the protection tube, wherein the lower end of the insulation rod is exposed within the protection tube holder through a lower end opening of the protection tube, and the lower end of the insulation rod in the protection tube holder and the wire holding portion are spaced apart from a bottom portion of the protection tube holder by at least 10 mm.

As the fourth invention, the temperature detecting apparatus according to the first to third inventions further includes an expanded portion where the thermocouple wire between the upper end surface of the insulation rod and the thermocouple junction portion expands outward in a horizontal direction.

As the fifth invention, in the temperature detecting apparatus according to the second to fourth inventions, the lower end of the insulation rod is positioned higher than the wire holding portion.

As the sixth invention, in the temperature detecting apparatus according to the fourth or fifth invention, the lower end of the insulation rod is supported by the insulation rod stopper, and a lower end of the insulation rod stopper is supported by the bottom portion of the protection tube holder.

As the seventh invention, in the temperature detecting apparatus according to the first to sixth inventions, the insulation rod includes four of the through-hole in the vertical direction, and two pairs of the thermocouple wire pass through the insulation rod.

As the eighth invention, in the temperature detecting apparatus according to the first to seventh inventions, the thermocouple wire is fixed to the insulation rod by injecting an adhesive into a cut portion of the insulation rod.

As the ninth invention, in the temperature detecting apparatus according to the eighth invention, the thermocouple wire exposed through the cut portion is fixed by injecting the adhesive into the cut portion in a bent state.

As the tenth invention, in the temperature detecting apparatus according to the eighth or ninth invention, the cut portion is disposed between a middle portion and a front end of the insulation rod.

The eleventh invention relates to a substrate processing apparatus. The substrate processing apparatus includes: a boat configured to stack and hold a plurality of substrates to be spaced apart from one another at predetermined intervals in a vertical direction; a reaction tube configured to accommodate the boat and process the plurality of substrates held by the boat; a heating unit installed around the reaction tube and configured to heat the plurality of substrate accommodated in the reaction tube; a temperature detecting apparatus configured to detect an inside temperature of the reaction tube; a processing gas supply unit configured to supply a processing gas into the reaction tube; and an exhaust portion configured to exhaust a gas from an inside of the reaction tube, wherein the temperature detecting apparatus includes: an insulation rod installed to extend in a vertical direction and including a through-hole in vertical direction; a thermocouple wire inserted in the through-hole of the insulation rod, the thermocouple wire including a thermocouple junction portion at an upper end thereof and an angled portion at a lower end of the insulation rod; and a buffer area installed below the insulation rod and configured to suppress a restriction of a horizontal portion of the angled portion upon heat expansion, wherein an upper portion of the thermocouple wire or a middle portion in the vertical direction are supported by the insulation rod.

The twelfth invention relates to a temperature detecting apparatus. The temperature detecting apparatus includes; an insulation rod installed to extend in a vertical direction and including a through-hole in vertical direction; a thermocouple wire inserted in the through-hole of the insulation rod, the thermocouple wire including a thermocouple junction portion at an upper end thereof and an angled portion at a lower end of the insulation rod; and a buffer area installed below the insulation rod and configured to suppress a restriction of a horizontal portion of the angled portion upon heat expansion, wherein the thermocouple wire includes a supported portion between an upper end surface of the insulation rod and the thermocouple junction portion, the supported portion supported by the upper end surface of the insulation rod.

The second to eleventh inventions described above may be applied to the twelfth invention.

As the thirteenth invention, in the temperature detecting apparatus according to the twelfth invention, the supported portion includes an expanded portion where the thermocouple wire between the upper end surface of the insulation rod and the thermocouple junction portion expands outward in a horizontal direction.

As the fourteenth invention, in the temperature detecting apparatus according to the thirteenth invention, a horizontal width of the expanded portion is greater than a maximum distance between outer peripheries of the through-holes in the insulation rod at the upper end surface of the insulation rod.

The fifteenth invention relates to a substrate processing apparatus. The substrate processing apparatus includes: a boat configured to stack and hold a plurality of substrates to be spaced apart from one another at predetermined intervals in a vertical direction; a reaction tube configured to accommodate the boat and process the plurality of substrates held by the boat; a heating unit installed around the reaction tube and configured to heat the plurality of substrate accommodated in the reaction tube; a temperature detecting apparatus configured to detect an inside temperature of the reaction tube; a processing gas supply unit configured to supply a processing gas into the reaction tube; and an exhaust portion configured to exhaust a gas from an inside of the reaction tube, wherein the temperature detecting apparatus includes: an insulation rod installed to extend in a vertical direction and including a through-hole in vertical direction; a thermocouple wire inserted in the through-hole of the insulation rod, the thermocouple wire including a thermocouple junction portion at an upper end thereof and an angled portion at a lower end of the insulation rod; and a buffer area installed below the insulation rod and configured to suppress a restriction of a horizontal portion of the angled portion upon heat expansion, wherein the thermocouple wire includes a supported portion between an upper end surface of the insulation rod and the thermocouple junction portion, the supported portion supported by the upper end surface of the insulation rod.

The sixteenth invention relates to a method of manufacturing a semiconductor device in a substrate processing apparatus including: a boat configured to stack and hold a plurality of substrates to be spaced apart from one another at predetermined intervals in a vertical direction; a reaction tube configured to accommodate the boat and process the plurality of substrates held by the boat; a heating unit installed around the reaction tube and configured to heat the plurality of substrate accommodated in the reaction tube; a temperature detecting apparatus configured to detect an inside temperature of the reaction tube; a processing gas supply unit configured to supply a processing gas into the reaction tube; and an exhaust portion configured to exhaust a gas from an inside of the reaction tube, wherein the temperature detecting apparatus includes: an insulation rod installed to extend in a vertical direction and including a through-hole in vertical direction; a thermocouple wire inserted in the through-hole of the insulation rod, the thermocouple wire including a thermocouple junction portion at an upper end thereof and an angled portion at a lower end of the insulation rod; and a buffer area installed below the insulation rod and configured to suppress a restriction of a horizontal portion of the angled portion upon heat expansion, wherein the thermocouple wire includes a supported portion between an upper end surface of the insulation rod and the thermocouple junction portion, the supported portion supported by the upper end surface of the insulation rod, the method including rising:

accommodating the boat holding the plurality of substrates in the reaction tube;

heating the inside of the reaction tube to a predetermined temperature using the heating unit while detecting the inside temperature of the reaction tube by the temperature detecting apparatus;

processing the plurality of substrates held by the boat by supplying the processing gas into the reaction tube by the processing gas supply unit and exhausting the gas from the inside of the reaction tube by the exhaust portion; and unloading the boat holding the plurality of substrates from the reaction tube.

What is claimed is:

1. A temperature detecting unit comprising:
   a vertically extending insulation rod installed in a protection member and having a through-hole therein extending in a vertical direction; and
   a thermocouple wire inserted in the through-hole of the insulation rod, the thermocouple wire including a thermocouple junction portion protruding from an upper end of the insulation rod, an angled portion protruding from a lower end of the insulation rod and a horizontal portion disposed at a rear end of the angled portion elongated in a horizontal direction,
   wherein the horizontal portion is positioned higher than a lowermost end of the angled portion.

2. The temperature detecting unit according to claim 1, further comprising an insulation rod support portion supporting the lower end of the insulation rod, the insulation rod support portion having a through-hole therein extending in vertical direction and passing the thermocouple wire therethrough.

3. The temperature detecting unit according to claim 2, wherein the angled portion is disposed in a buffer area configured to suppress a restriction of the thermocouple wire protruding from the lower end of the insulation rod upon heat expansion.

4. The temperature detecting unit according to claim 3, wherein the horizontal portion is disposed in the buffer area.

5. The temperature detecting unit according to claim 3, wherein the insulation rod support portion supports the lower end of the insulation rod at a position higher than the buffer area.

6. The temperature detecting unit according to claim 2, wherein the insulation rod support portion further comprises a notch portion in communication with the through-hole of the insulation rod support portion.

7. The temperature detecting unit according to claim 6, wherein at least part of the notch portion is disposed in a buffer area configured to suppress a restriction of the thermocouple wire protruding from the lower end of the insulation rod upon heat expansion.

8. The temperature detecting unit according to claim 2, wherein the protection member comprises a protection tube extending vertically and a protection tube holder of a hollow structure supporting the protection tube.

9. The temperature detecting unit according to claim 8, wherein a bottom portion of the protection tube holder supports a lower end of the insulation rod support portion.

10. The temperature detecting unit according to claim 8, wherein the angled portion and the horizontal portion are disposed in the protection tube holder.

11. The temperature detecting unit according to claim 8, wherein a distance between the horizontal portion and a bottom portion of the protection tube holder ranges from 10 mm to 15 mm.

12. The temperature detecting unit according to claim 8, wherein the angled portion is disposed in a buffer area configured to suppress a restriction of the thermocouple wire protruding from the lower end of the insulation rod in the protection member upon heat expansion.

13. The temperature detecting unit according to claim 1, wherein the upper end of the insulation rod supports the thermocouple wire.

14. The temperature detecting unit according to claim 13, wherein an upper end of the thermocouple wire and the thermocouple junction portion are fixed to the upper end of the insulation rod by an adhesive.

15. The temperature detecting unit according to claim 1, wherein the insulation rod further comprises three through-holes extending in the vertical direction, and two pairs of the thermocouple wire pass through the insulation rod.

16. The temperature detecting unit according to claim 15, wherein the insulation rod comprises a notch portion in communication with the through-hole.

17. The temperature detecting unit according to claim 16, further comprising a cylindrical cover installed at an opening of the notch portion.

18. A substrate processing apparatus, comprising:
a reaction tube configured to process a plurality of substrates held by a substrate holding unit configured to stack and hold the plurality of substrates;
   a heating unit installed around the reaction tube and configured to heat the plurality of substrates accommodated in the reaction tube;
   a temperature detecting unit configured to detect an inside temperature of the reaction tube;
   a processing gas supply unit configured to supply a processing gas into the reaction tube; and
   an exhaust portion configured to exhaust a gas from an inside of the reaction tube, wherein the temperature detecting unit comprises: a vertically extending insulation rod installed in a protection member and having a through-hole therein extending in a vertical direction; and a thermocouple wire inserted in the through-hole of the insulation rod, the thermocouple wire including a thermocouple junction portion protruding from an upper end of the insulation rod, an angled portion protruding from a lower end of the insulation rod and a horizontal portion disposed at a rear end of the angled portion elongated in a horizontal direction,
   wherein the horizontal portion is positioned higher than a lowermost end of the angled portion.

19. A method of manufacturing a semiconductor device using a temperature detecting unit, the method comprising:
   accommodating a plurality of substrates in a reaction tube to heat the plurality of substrates by a heating unit installed around the reaction tube;
   controlling an inside temperature of the reaction tube based on a temperature detected by the temperature detecting unit comprising: a vertically extending insulation rod installed in a protection member and having a through-hole therein extending in a vertical direction; and a thermocouple wire inserted in the through-hole of the insulation rod, the thermocouple wire including a thermocouple junction portion protruding from an upper end of the insulation rod, an angled portion protruding from a lower end of the insulation rod and a horizontal portion disposed at a rear end of the angled portion elongated in a horizontal direction, wherein the horizontal portion is positioned higher than a lowermost end of the angled portion; and processing the plurality of substrates in the reaction tube.

* * * * *